US012641967B2

(12) United States Patent
Noh et al.

(10) Patent No.: US 12,641,967 B2
(45) Date of Patent: May 26, 2026

(54) DISPLAY DEVICE

(71) Applicant: Samsung Display Co., LTD., Yongin-si (KR)

(72) Inventors: Jung Hun Noh, Yongin-si (KR); Su Jin Lee, Yongin-si (KR); Bon Yong Koo, Yongin-si (KR); Ki Seong Seo, Yongin-si (KR); Ju Won Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 371 days.

(21) Appl. No.: 18/358,118

(22) Filed: Jul. 25, 2023

(65) Prior Publication Data

US 2024/0155885 A1    May 9, 2024

(30) Foreign Application Priority Data

Nov. 9, 2022    (KR) ........................ 10-2022-0148405

(51) Int. Cl.
| | |
|---|---|
| *H10K 59/126* | (2023.01) |
| *H10K 50/115* | (2023.01) |
| *H10K 59/122* | (2023.01) |
| *H10K 59/123* | (2023.01) |
| *H10K 59/131* | (2023.01) |
| *H10K 59/35* | (2023.01) |
| *H10K 59/38* | (2023.01) |
| *H10K 59/88* | (2023.01) |
| *H10K 102/00* | (2023.01) |

(52) U.S. Cl.
CPC ......... *H10K 59/126* (2023.02); *H10K 59/122* (2023.02); *H10K 59/123* (2023.02); *H10K 59/131* (2023.02); *H10K 59/38* (2023.02);

*H10K 59/88* (2023.02); *H10K 50/115* (2023.02); *H10K 59/35* (2023.02); *H10K 2102/341* (2023.02)

(58) Field of Classification Search
CPC .. H10K 59/126; H10K 59/122; H10K 59/123; H10K 59/131; H10K 59/38; H10K 59/88; H10K 59/35; H10K 59/8792; H10K 59/12; H10K 59/8791; H10K 59/90; H10K 50/115; H10K 2102/341; H01L 25/167; H01L 25/0753; H10H 20/857; H10H 20/855; H10H 20/84; H10H 20/8514; H10H 20/83; H10H 20/8515; H10H 29/142; H10D 86/441
See application file for complete search history.

(56) References Cited

U.S. PATENT DOCUMENTS

2022/0384540 A1*  12/2022  Qin ...................... H10K 59/873

FOREIGN PATENT DOCUMENTS

| | | |
|---|---|---|
| KR | 10-2019-0068113 | 6/2019 |
| KR | 10-2067090 | 1/2020 |
| KR | 10-2021-0018582 | 2/2021 |

* cited by examiner

*Primary Examiner* — Anne M Hines
*Assistant Examiner* — Jose M Diaz
(74) *Attorney, Agent, or Firm* — CANTOR COLBURN LLP

(57) ABSTRACT

Provided is a display device. A display device includes a display area and a buffer area disposed around the display area, a pixel electrode disposed on a substrate and in the display area, a bank covering an edge of the pixel electrode, light emitting elements disposed on the pixel electrode and extending in a thickness direction of the substrate, and a buffer disposed on the substrate and in the buffer area. The bank and the buffer are disposed on a same layer.

19 Claims, 35 Drawing Sheets

FIG. 2
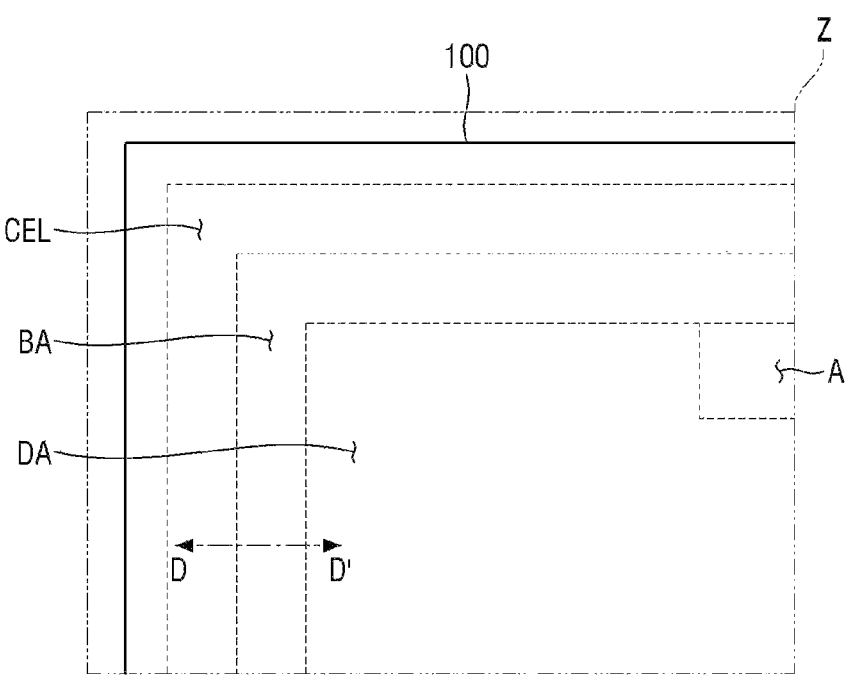
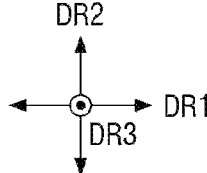

PX: SPX1, SPX2, SPX3

ACT1: CHA1, S1, D1          ACT2: CHA2, S2, D2
GTL1: G1, TFT1, CAE1        GTL2: CAE2
GTL3: G2, TFT2             DTL1: PCE1, BE1, BE2
DTL2: PCE2                 PXL: PXE
EML: PXE, LE1, LE2, LE3, CE, 191, 192

FIG. 21

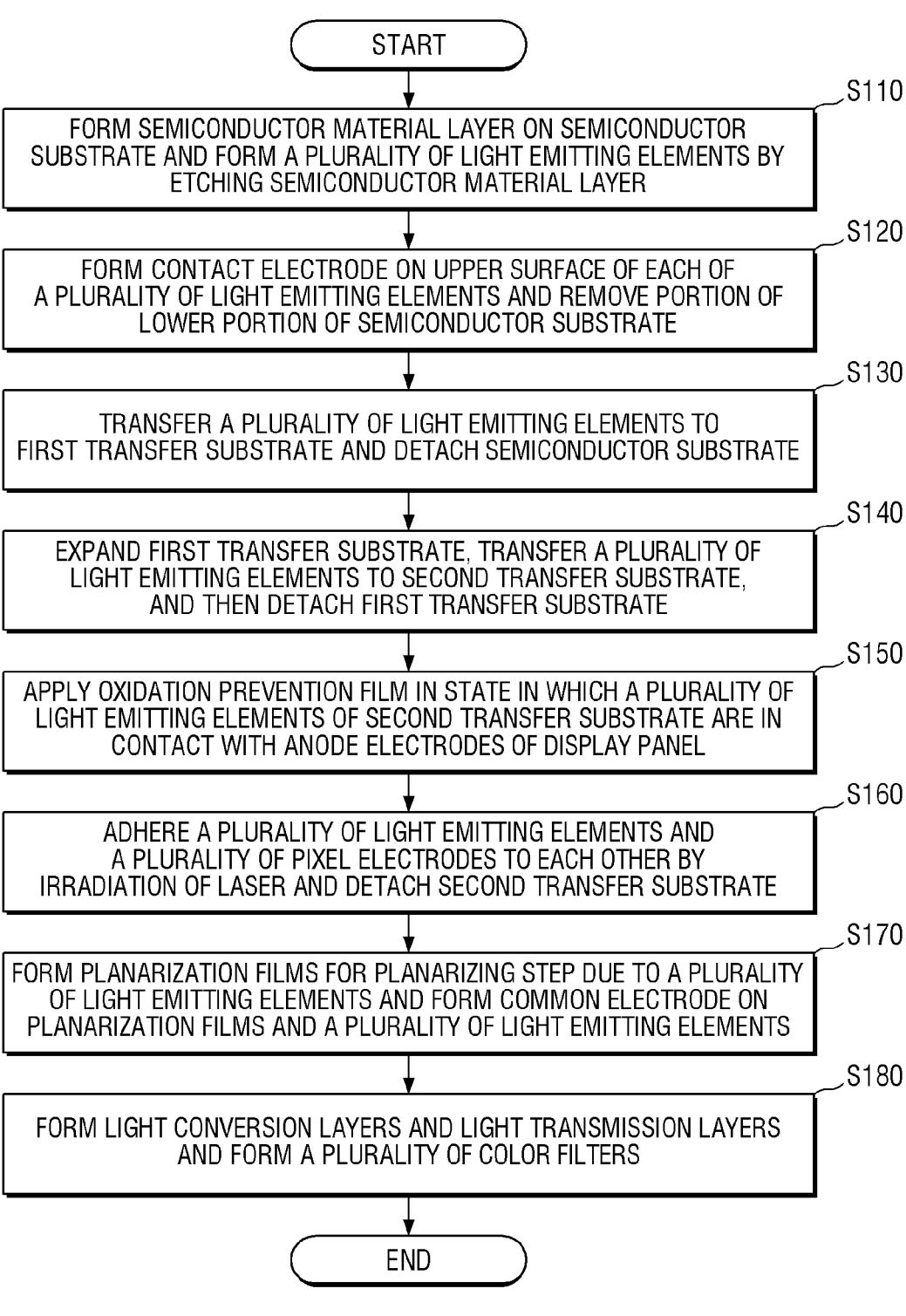

START

S110
FORM SEMICONDUCTOR MATERIAL LAYER ON SEMICONDUCTOR
SUBSTRATE AND FORM A PLURALITY OF LIGHT EMITTING ELEMENTS BY
ETCHING SEMICONDUCTOR MATERIAL LAYER

S120
FORM CONTACT ELECTRODE ON UPPER SURFACE OF EACH OF
A PLURALITY OF LIGHT EMITTING ELEMENTS AND REMOVE PORTION OF
LOWER PORTION OF SEMICONDUCTOR SUBSTRATE

S130
TRANSFER A PLURALITY OF LIGHT EMITTING ELEMENTS TO
FIRST TRANSFER SUBSTRATE AND DETACH SEMICONDUCTOR SUBSTRATE

S140
EXPAND FIRST TRANSFER SUBSTRATE, TRANSFER A PLURALITY OF
LIGHT EMITTING ELEMENTS TO SECOND TRANSFER SUBSTRATE,
AND THEN DETACH FIRST TRANSFER SUBSTRATE

S150
APPLY OXIDATION PREVENTION FILM IN STATE IN WHICH A PLURALITY OF
LIGHT EMITTING ELEMENTS OF SECOND TRANSFER SUBSTRATE ARE IN
CONTACT WITH ANODE ELECTRODES OF DISPLAY PANEL

S160
ADHERE A PLURALITY OF LIGHT EMITTING ELEMENTS AND
A PLURALITY OF PIXEL ELECTRODES TO EACH OTHER BY
IRRADIATION OF LASER AND DETACH SECOND TRANSFER SUBSTRATE

S170
FORM PLANARIZATION FILMS FOR PLANARIZING STEP DUE TO A PLURALITY
OF LIGHT EMITTING ELEMENTS AND FORM COMMON ELECTRODE ON
PLANARIZATION FILMS AND A PLURALITY OF LIGHT EMITTING ELEMENTS

S180
FORM LIGHT CONVERSION LAYERS AND LIGHT TRANSMISSION LAYERS
AND FORM A PLURALITY OF COLOR FILTERS

END

DISPLAY DEVICE

CROSS-REFERENCE TO RELATED APPLICATION(S)

This application claims priority to and benefits of Korean Patent Application No. 10-2022-0148405 under 35 U.S.C. § 119, filed on Nov. 9, 2022, in the Korean Intellectual Property Office, the entire contents of which are incorporated herein by reference.

BACKGROUND

1. Technical Field

Embodiments relate to a display device.

2. Description of the Related Art

As the information society develops, the demand for display devices for displaying images has increased and diversified. The display devices may be flat panel display devices such as liquid crystal displays (LCDs), field emission displays (FED s), or light emitting displays (LEDs). Light emitting display devices may include an organic light emitting display device including organic light emitting diode elements as light emitting elements, an inorganic light emitting display device including inorganic semiconductor elements as light emitting elements, and a micro light emitting display device including micro light emitting diode elements as light emitting elements.

In case that attachment errors of the micro light emitting diode elements are taken into consideration at the time of manufacturing the micro light emitting display device, the micro light emitting diode elements may be attached to a non-display area, which is a peripheral portion of a display area. The micro light emitting diode elements disposed in the non-display area should be dummy light emitting diode elements that do not emit light. However, in case that the micro light emitting diode elements disposed in the non-display area are short-circuited to lines or electrodes, light leakage may occur in the non-display area.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device capable of preventing light leakage from occurring due to a short circuit between micro light emitting diode elements and lines or electrodes in a non-display area.

The technical objectives to be achieved by the disclosure are not limited to those described herein, and other technical objectives that are not mentioned herein would be clearly understood by a person skilled in the art from the description of the disclosure.

Additional features of embodiments will be set forth in the description which follows, and in part may be apparent from the description, or may be learned by practice of an embodiment or embodiments herein.

According to an embodiment, a display device may include a display area and a buffer area disposed around the display area; a pixel electrode disposed on a substrate and in the display area; a bank covering an edge of the pixel electrode; light emitting elements disposed on the pixel electrode and extending in a thickness direction of the substrate; and a buffer disposed on the substrate and in the buffer area. The bank and the buffer are disposed on a same layer.

The bank and the buffer may include a same organic material.

The display device may further include a dummy light emitting element disposed on the buffer and extending in the thickness direction of the substrate.

A portion of the dummy light emitting element may be fixed to at least a portion of the buffer.

The display device may further include a common electrode disposed on the light emitting elements and the dummy light emitting element.

The display device may further include a light blocking layer disposed on the dummy light emitting element in the buffer area.

The light blocking layer may overlap the buffer in the thickness direction of the substrate.

The light blocking layer may be disposed on the bank in the display area and may not overlap the light emitting elements in the thickness direction of the substrate.

The display device may further include a color conversion layer including color conversion elements disposed on the light emitting elements. The light blocking layer may partition the color conversion layer.

The display device may further include a first color filter disposed on the light blocking layer in the buffer area, a second color filter disposed on the first color filter, and a third color filter disposed on the second color filter.

Any one of the first color filter, the second color filter, and the third color filter may be disposed on the color conversion layer.

The bank may include an organic material, and the buffer may include an inorganic material.

A thickness of the bank may be greater than a thickness of the buffer.

The buffer may include a first buffer disposed on the substrate and including an organic material; and a second buffer disposed on the first buffer and including an inorganic material.

A thickness of the first buffer may be greater than a thickness of the second buffer.

The bank may include a first bank disposed on the substrate; and a second bank disposed on the first bank. The first buffer and the first bank may include a same material, and the second buffer and the second bank may include a same material.

According to an embodiment, a display device may include a display area and a buffer area disposed around the display area; a pixel electrode disposed on a substrate and in the display area, a bank covering an edge of the pixel electrode, light emitting elements disposed on the pixel electrode and extending in a thickness direction of the substrate, a buffer disposed on the substrate and in the buffer area, and a light blocking layer disposed on the buffer in the buffer area and blocking light.

The light blocking layer may be disposed on the bank in the display area and may not overlap the light emitting elements in the thickness direction of the substrate.

The display device may further include a color conversion layer including color conversion elements disposed on the light emitting elements. The light blocking layer may partition the color conversion layer.

The display device may further include a dummy light emitting element disposed on the buffer in the buffer area and extending in the thickness direction of the substrate, and a common electrode disposed on the light emitting elements and the dummy light emitting element. The light blocking layer may be disposed on the common electrode.

With a display device according to embodiments, by disposing a buffer made of an organic material in a buffer area neighboring to a display area, light emitting elements bonded to a non-display area may be stuck and fixed to the buffer. For example, since dummy light emitting elements unintentionally disposed in the non-display area may be fixed by the buffer, it is possible to prevent the dummy light emitting elements disposed in the non-display area from being short-circuited to lines or electrodes. It is possible to prevent contamination of a manufacturing line due to falling-off of the dummy light emitting elements unintentionally disposed in the non-display area during manufacturing processes.

Due to a stacked structure of a first light blocking layer, a second light blocking layer, a first color filter, a second color filter, and a third color filter in the buffer area, it is possible to prevent light of the dummy light emitting elements from being emitted to the outside even though the dummy light emitting elements disposed in the non-display area are short-circuited to the lines or the electrodes to emit the light.

Further, in case that the buffer is formed as an inorganic film, contact electrodes of the dummy light emitting elements disposed in the non-display area are not bonded to the buffer by a bonding process such as melt-bonding, adhering through a conductive adhesive member, or soldering bonding, and thus, the dummy light emitting elements may fall off. Therefore, in case that the buffer is formed as the inorganic film, it is possible to prevent the dummy light emitting elements from being disposed in the non-display area.

Furthermore, in case that the buffer may include a first buffer formed as an organic film and a second buffer disposed on the first buffer and formed as an inorganic film, contact electrodes of the dummy light emitting elements disposed in the non-display area are not bonded to the second buffer by a bonding process such as melt-bonding, adhering through a conductive adhesive member, or soldering bonding, and thus, the dummy light emitting elements may fall off. Therefore, in case that the second buffer is formed as the inorganic film, it is possible to prevent the dummy light emitting elements from being disposed in the non-display area.

Other features and embodiments may be apparent from the following detailed description, the drawings, and the claims.

BRIEF DESCRIPTION OF THE DRAWINGS

The accompanying drawings, which are included to provide a further understanding of the disclosure, illustrate embodiments in which:

FIG. 2 is a plan diagram illustrating area Z of FIG. 1 in detail;

FIG. 21 is a flowchart illustrating a manufacturing method of a display device according to an embodiment.

DETAILED DESCRIPTION OF THE EMBODIMENTS

Figure 1:
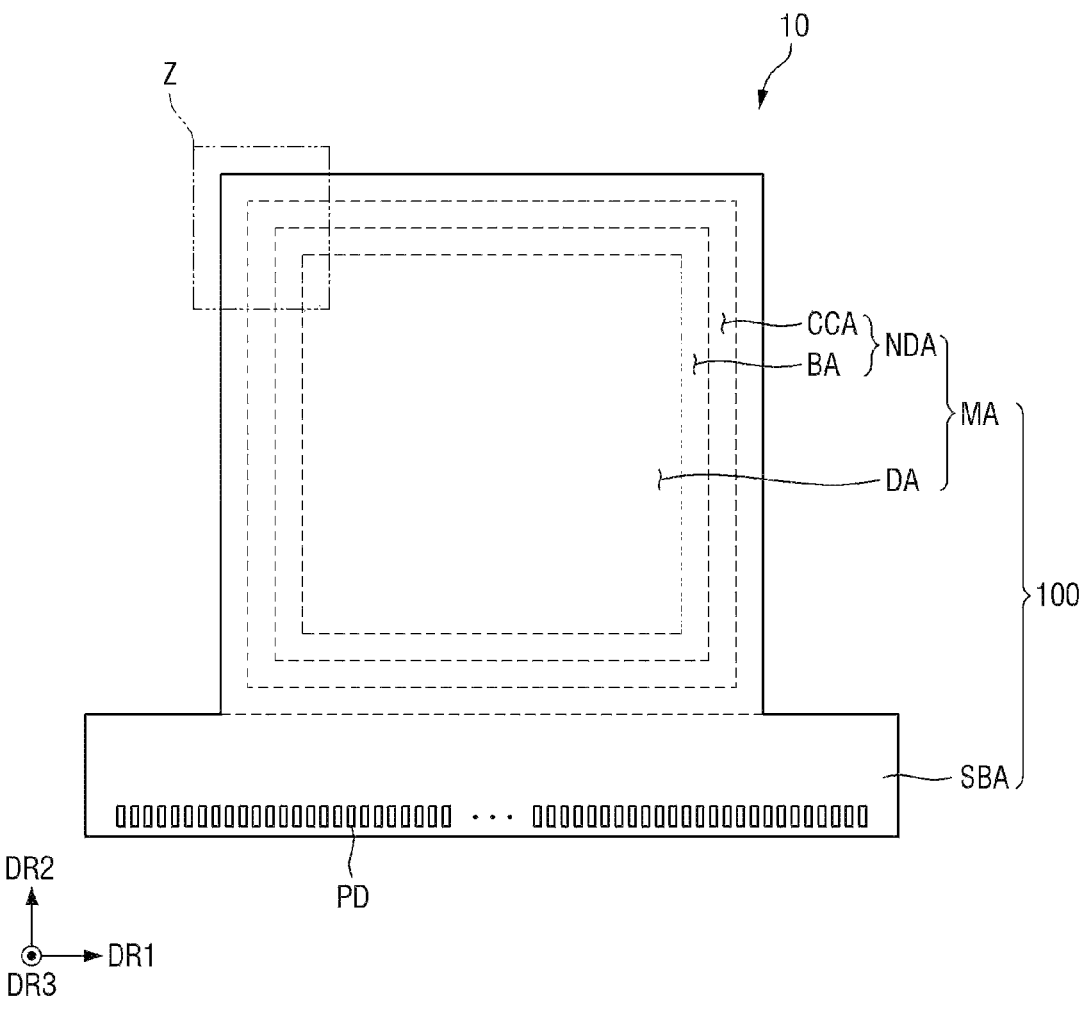
FIG. 1 is a schematic plan view illustrating a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view illustrating a display device according to an embodiment. FIG. 2 is a plan diagram illustrating area Z of FIG. 1 in detail.

Referring to FIGS. 1 and 2, a display device 10 is a device that displays a moving image or a still image, and may be used as a display screen of various products such as televisions, laptop computers, monitors, billboards, and the Internet of Things (JOT) devices as well as portable electronic devices such as mobile phones, smartphones, tablet personal computers (PCs), smart watches, watch phones, mobile communication terminals, virtual reality devices, augmented reality devices, electronic notebooks, electronic books, portable multimedia players (PMPs), navigation devices, and ultra mobile PCs (UMPCs).

The display device 10 may be a light emitting display device such as an organic light emitting display device using an organic light emitting diode, a quantum dot light emitting display device including a quantum dot light emitting layer, an inorganic light emitting display device including an inorganic semiconductor, and a micro light emitting display device using a micro or nano light emitting diode (micro LED or nano LED). Hereinafter, it will be described that the display device 10 is the micro light emitting display device, but the disclosure is not limited thereto. Hereinafter, for convenience of explanation, the micro or nano light emitting diode will be described as a micro light emitting diode.

The display device 10 may include a display panel 100. The display panel 100 may be formed in a rectangular shape, in plan view, having short sides in a first direction DR1 and long sides in a second direction DR2 intersecting the first direction DR1. It has been illustrated in FIGS. 1 and 2 that a corner where the short side in the first direction DR1 and the long side in the second direction DR2 meet may be right-angled, but the corner may also be rounded with a selectable curvature. The shape of the display panel 100 in plan view is not limited to the rectangular shape, and may be other polygonal shapes, a circular shape, or an elliptical shape. The display panel 100 may be formed to be flat, but is not limited thereto. For example, the display panel 100 may include curved surface parts formed at left and right ends thereof and having a constant curvature or a variable curvature. The display panel 100 may be flexibly formed to be curved, bent, folded, or rolled.

The display panel 100 may include a main area MA and a sub-area SBA. The main area MA may include a display area DA displaying an image and a non-display area NDA, which is a peripheral area of the display area DA.

The display area DA may occupy most of the main area MA. The display area DA may be disposed at the center of the main area MA. The display area DA may include sub-pixels SPX1, SPX2, and SPX3 (see FIG. 5) displaying an image. For example, the display area DA may include first sub-pixels SPX1 (see FIG. 5) emitting first light, second sub-pixels SPX2 (see FIG. 5) emitting second light, and third sub-pixels SPX3 (see FIG. 5) emitting third light.

The non-display area NDA may include a buffer area BA and a common connection area CEL and area CCA. The buffer area BA is an area for preventing light emitting elements disposed in the non-display area NDA from being short-circuited to lines or electrodes in case that light emitting elements are bonded to an area wider than the display area DA in consideration of attachment errors in manufacturing processes of the display device 10. The common connection area CEL is an area in which a common electrode CE (see FIG. 6) is connected to a power line to which a low potential voltage is applied.

The buffer area BA may be disposed to neighbor to the display area DA. The buffer area BA may be an area outside the display area DA. The buffer area BA may be disposed to surround the display area DA. The buffer area BA may be disposed between the display area DA and the common connection area CEL.

The common connection area CEL may be disposed to neighbor to the buffer area BA. The common connection area CEL may be an area outside the buffer area BA. The common connection area CEL may be disposed to surround the buffer area BA. The common connection area CEL may be an edge area of the display panel 100.

The sub-area SBA may protrude from one side or a side of the main area MA in the second direction DR2. A length of the sub-area SBA in the first direction DR1 may be greater than a length of the main area MA in the first direction DR1. A length of the sub-area SBA in the second direction DR2 may be smaller than the length of the main area MA in the second direction DR2. The sub-area SBA may be bent and be disposed below the display panel 100. The sub-area SBA may overlap the main area MA in a third direction DR3.

Pads PD may be disposed in the sub-area SBA. The pads PD may be attached to a circuit board using a conductive adhesive member such as an anisotropic conductive film. The circuit board may be mounted with a display driving circuit for driving the display panel 100. Digital video data, timing signals, and driving voltages of the display driving circuit may be supplied to the pads PD of the display panel 100 through the circuit board. The circuit board may be a flexible printed circuit board, a printed circuit board, or a flexible film such as a chip on film.

Figure 3:
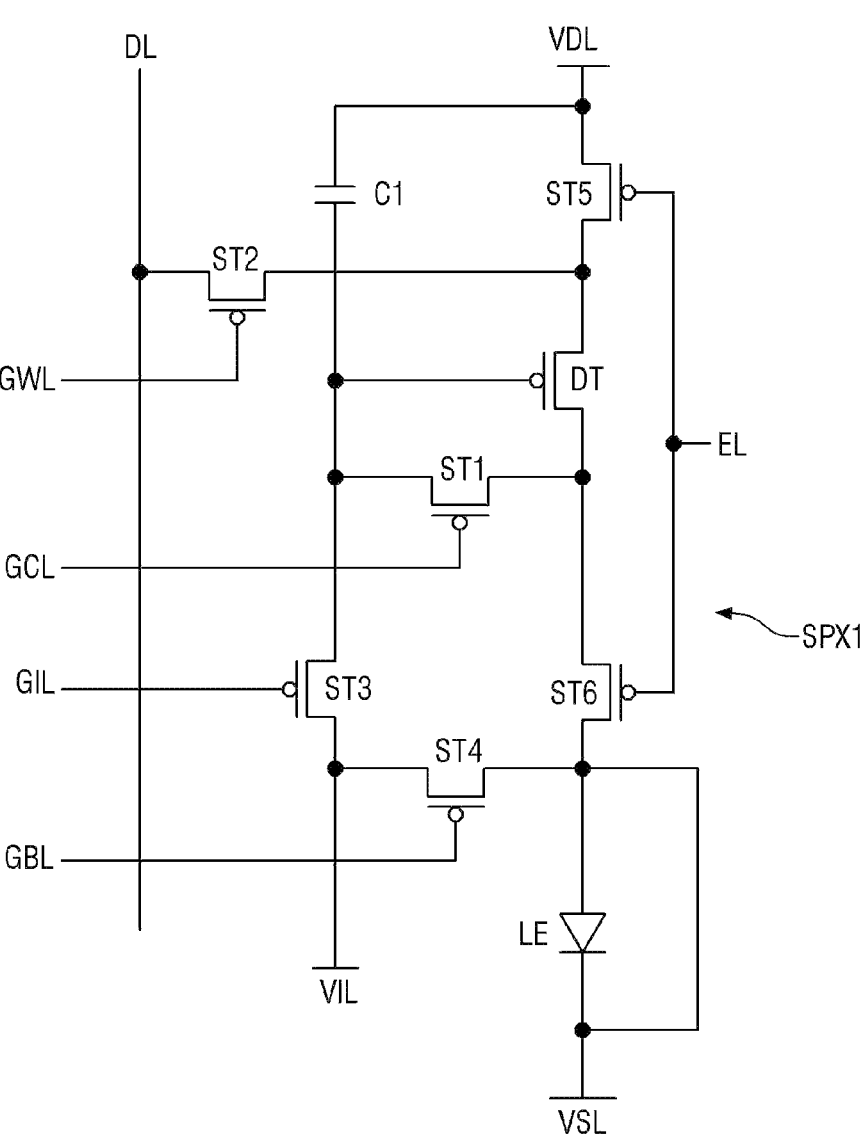
FIG. 3 is a schematic diagram of an equivalent circuit illustrating a first sub-pixel of a display panel according to an embodiment.

FIG. 3 is a schematic circuit diagram illustrating a first sub-pixel of a display panel according to an embodiment.

Referring to FIG. 3, the first sub-pixel SPX1 according to an embodiment may be connected to scan lines GWL, GIL, GCL, and GBL, an emission line EL, and a data line DL. For example, the first sub-pixel SPX1 may be connected to a write scan line GWL, an initialization scan line GIL, a control scan line GCL, a bias scan line GBL, an emission line EL, and a data line DL.

The first sub-pixel SPX1 according to an embodiment may include a driving transistor DT, switch elements, a capacitor C1, and a light emitting element LE. The switch elements include first to sixth transistors ST1, ST2, ST3, ST4, ST5, and ST6.

The driving transistor DT may include a gate electrode, a first electrode, and a second electrode. The driving transistor DT controls a drain-source current (hereinafter, referred to as a "driving current") Ids flowing between the first electrode and the second electrode according to a data voltage applied to the gate electrode.

The light emitting element LE may be an organic light emitting diode including an anode electrode (or a pixel electrode), a cathode electrode (or a common electrode), and an organic light emitting layer disposed between the anode electrode and the cathode electrode. By way of example, the light emitting element LE may be an inorganic light emitting element including an anode electrode, a cathode electrode, and an inorganic semiconductor disposed between the anode electrode and the cathode electrode. By way of example, the light emitting element LE may be a quantum dot light emitting element including an anode electrode, a cathode electrode, and a quantum dot light emitting layer disposed between the anode electrode and the cathode electrode. By way of example, the light emitting element LE may be a micro light emitting diode. Hereinafter, for convenience of explanation, it will be described that the light emitting element LE is a micro light emitting diode.

The light emitting element LE emits light according to the driving current Ids. An amount of light emitted from the light emitting element LE may be proportional to the driving current Ids. The anode electrode of the light emitting element LE may be connected to a first electrode of the fourth transistor ST4 and a second electrode of the sixth transistor ST6, and the cathode electrode of the light emitting element LE may be connected to a second power line VSL to which a second source voltage is applied.

The capacitor C1 is formed between a second electrode of the driving transistor DT and a first power line VDL to which a first source voltage is applied. The first source voltage may be a voltage having a higher level than the second source voltage. One electrode of the capacitor C1 may be connected to the second electrode of the driving transistor DT, and the other electrode of the capacitor C1 may be connected to the first power line VDL.

As illustrated in FIG. 3, all of the first to sixth transistors ST1, ST2, ST3, ST4, ST5, and ST6, and the driving transistor DT may be formed as P-channel metal oxide semiconductor field effect transistors (MOSFETs). An active layer of each of the first to sixth transistors ST1, ST2, ST3, ST4, ST5, and ST6 and the driving transistor DT may be formed of polysilicon or an oxide semiconductor.

A gate electrode of the second transistor ST2 may be connected to the write scan line GWL, and a gate electrode of the first transistor ST1 may be connected to the control scan line GCL. A gate electrode of the third transistor ST3 may be connected to the initialization scan line GIL, and a gate electrode of the fourth transistor ST4 may be connected to the bias scan line GBL. The first to sixth transistors ST1, ST2, ST3, ST4, ST5, and ST6 are formed as the P-channel MOSFETs, and may thus be turned on in case that scan signals and an emission signal of a gate low voltage are applied to the control scan line GCL, the initialization scan line GIL, the write scan line GWL, the bias scan line GBL, and the emission line EL, respectively. One electrode of the third transistor ST3 and one electrode of the fourth transistor ST4 may be connected to an initialization voltage line VIL.

Figure 4:
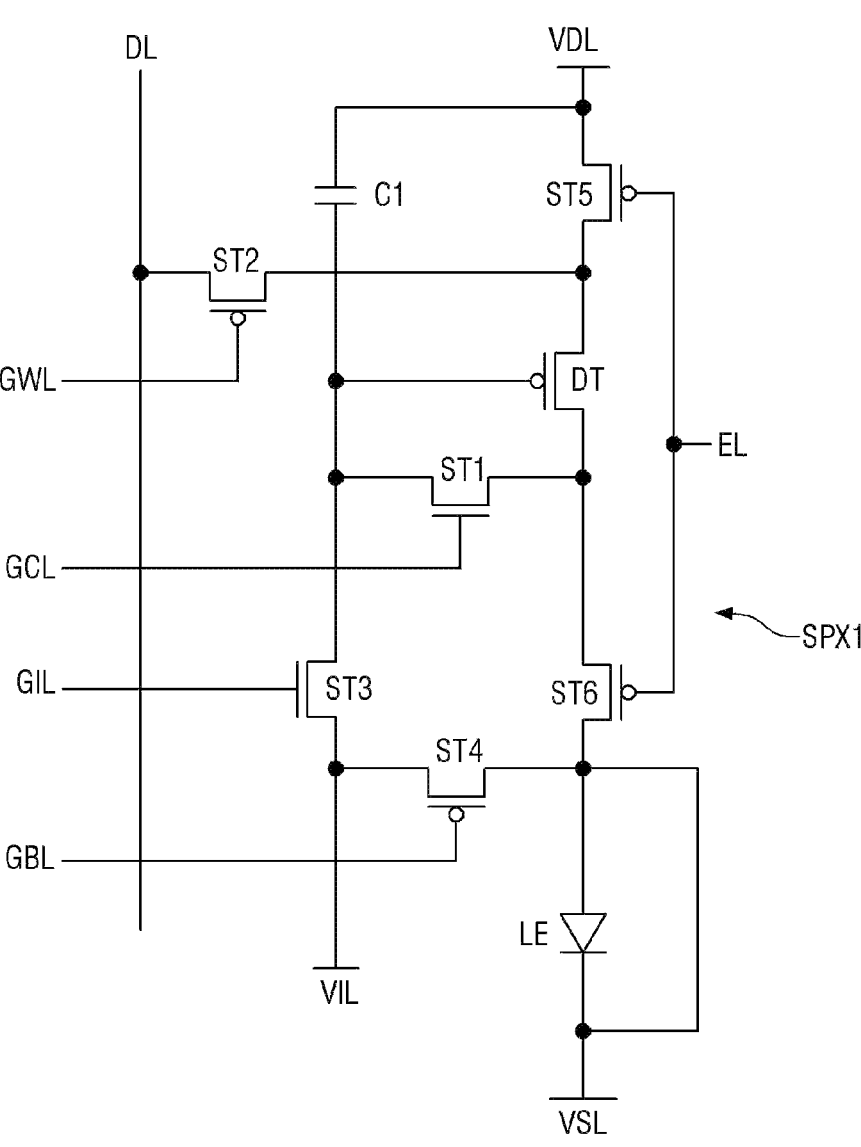
FIG. 4 is a schematic diagram of an equivalent circuit illustrating a first sub-pixel of a display panel according to an embodiment.

FIG. 4 is a schematic circuit diagram illustrating a first sub-pixel of a display panel according to an embodiment.

Referring to FIG. 4, the driving transistor DT, the second transistor ST2, the fourth transistor ST4, the fifth transistor ST5, and the sixth transistor ST6 may be formed as P-channel MOSFETs, and the first transistor ST1 and the third transistor ST3 may be formed as N-channel MOSFETs. An active layer of each of the driving transistor DT, the second transistor ST2, the fourth transistor ST4, the fifth transistor ST5, and the sixth transistor ST6 formed as the P-channel MOSFETs may be formed of polysilicon, and an active layer of each of the first transistor ST1 and the third transistor ST3 formed as the N-channel MOSFETs may be formed of an oxide semiconductor. The transistors formed of the polysilicon and the transistors formed of the oxide semiconductor may be disposed at different layers.

Since the first transistor ST1 and the third transistor ST3 are formed as the N-channel MOSFETs, the first transistor ST1 may be turned on in case that a control scan signal of a gate high voltage is applied to the control scan line GCL, and the third transistor ST3 may be turned on in case that an initialization scan signal is applied to the initialization scan line GIL. In contrast, the second transistor ST2, the fourth transistor ST4, the fifth transistor ST5, and the sixth transistor ST6 are formed as the P-channel MOSFETs, and may thus be turned on in case that scan signals and an emission signal of a gate low voltage are applied to the write scan line GWL, the bias scan line GBL, and the emission line EL, respectively.

By way of example, in FIG. 4, the fourth transistor ST4 may be formed as an N-channel MOSFET. An active layer of the fourth transistors ST4 may be formed of an oxide semiconductor. In a case where the fourth transistor ST4 is formed as the N-channel MOSFET, the fourth transistor ST4 may be turned on in case that a bias scan signal of a gate high voltage is applied to the bias scan line GBL.

By way of example, although not illustrated in FIGS. 3 and 4, all of the first to sixth transistors ST1, ST2, ST3, ST4, ST5, and ST6, and the driving transistor DT may be formed as N-channel MOSFETs.

A circuit diagram of the second sub-pixel SPX2 (see FIG. 5) and a circuit diagram of the third sub-pixel SPX3 (see FIG. 5) according to an embodiment are substantially the same as the circuit diagram of the first sub-pixel SPX1 described in conjunction with FIGS. 3 and 4, and a description thereof will thus be omitted.

Figure 5:
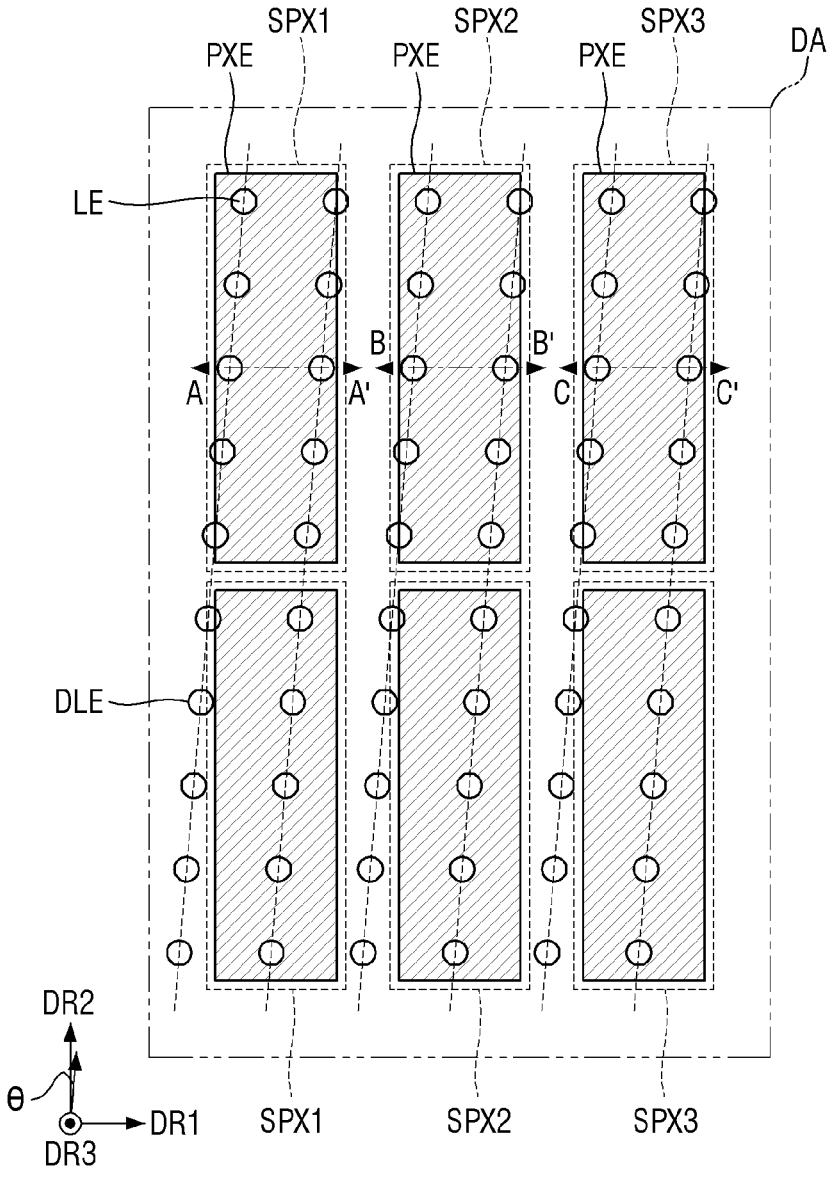
FIG. 5 is a plan diagram illustrating a display area of FIG. 2 in detail.

FIG. 5 is a plan diagram illustrating area A of FIG. 2 in detail. Area A may be a partial area of the display area DA.

Referring to FIG. 5, the display area DA may include pixels PX. Each of the pixels PX may include a first sub-pixel SPX1, a second sub-pixel SPX2, and a third sub-pixel SPX3.

The pixels PX may be arranged or disposed in a matrix form. In each of the pixels PX, the first sub-pixel SPX1, the second sub-pixel SPX2, and the third sub-pixel SPX3 may be arranged or disposed in the first direction DR1. The first sub-pixels SPX1 may be arranged or disposed in the second direction DR2, the second sub-pixels SPX2 may be arranged or disposed in the second direction DR2, and the third sub-pixels SPX3 may be arranged or disposed in the second direction DR2.

Each of the first sub-pixel SPX1, the second sub-pixel SPX2, and the third sub-pixel SPX3 may include a pixel electrode PXE and light emitting elements LE.

The pixel electrode PXE may have a rectangular shape, in plan view, having short sides in the first direction DR1 and long sides in the second direction DR2, but an embodiment is not limited thereto.

The light emitting elements LE may emit light of a blue wavelength band. The blue wavelength band may be about 370 nm to about 460 nm, but an embodiment is not limited thereto.

The light emitting elements LE may be arranged or disposed in the first direction DR1 and a fourth direction DR4 inclined by a first angle $\theta$ with respect to the second direction DR2. The first angle $\theta$ may be greater than 0° and equal to or less than 45°.

Since the light emitting elements LE are arranged or disposed in the fourth direction DR4 inclined by the first angle $\theta$ with respect to the second direction DR2, even though the light emitting elements LE are attached to the pixel electrode PXE without separate alignment in a process of attaching the light emitting elements LE to the pixel electrode PXE, two or more light emitting elements LE may be attached to the pixel electrode PXE. Even though a defect occurs in one of the two or more light emitting elements LE, the other light emitting element LE may emit light, and thus, a separate repair process is not required.

Light emitting elements DLE that are not disposed on the pixel electrodes PXE for convenience of explanation in FIG. 5 may be disposed on a bank 190 (see FIGS. 6 to 8) partitioning the pixel electrodes PXE. The light emitting element DLE disposed on the bank 190 (see FIGS. 6 to 8) other than on the pixel electrodes PXE may be dummy light emitting elements DLE that do not emit light.

Figure 6:
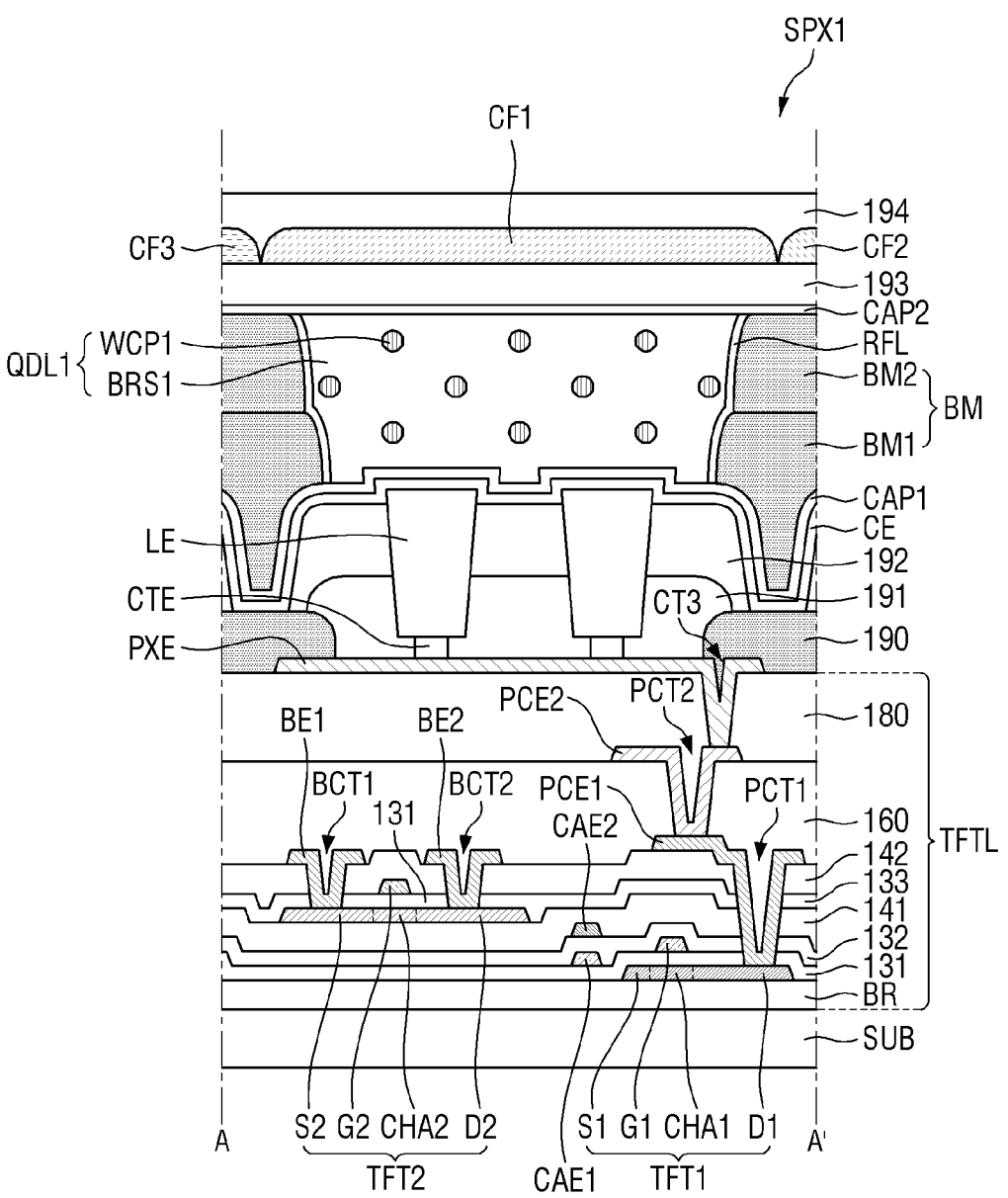
FIG. 6 is a schematic cross-sectional view illustrating an example of the display device taken along line A-A' of FIG. 5.
Figure 7:
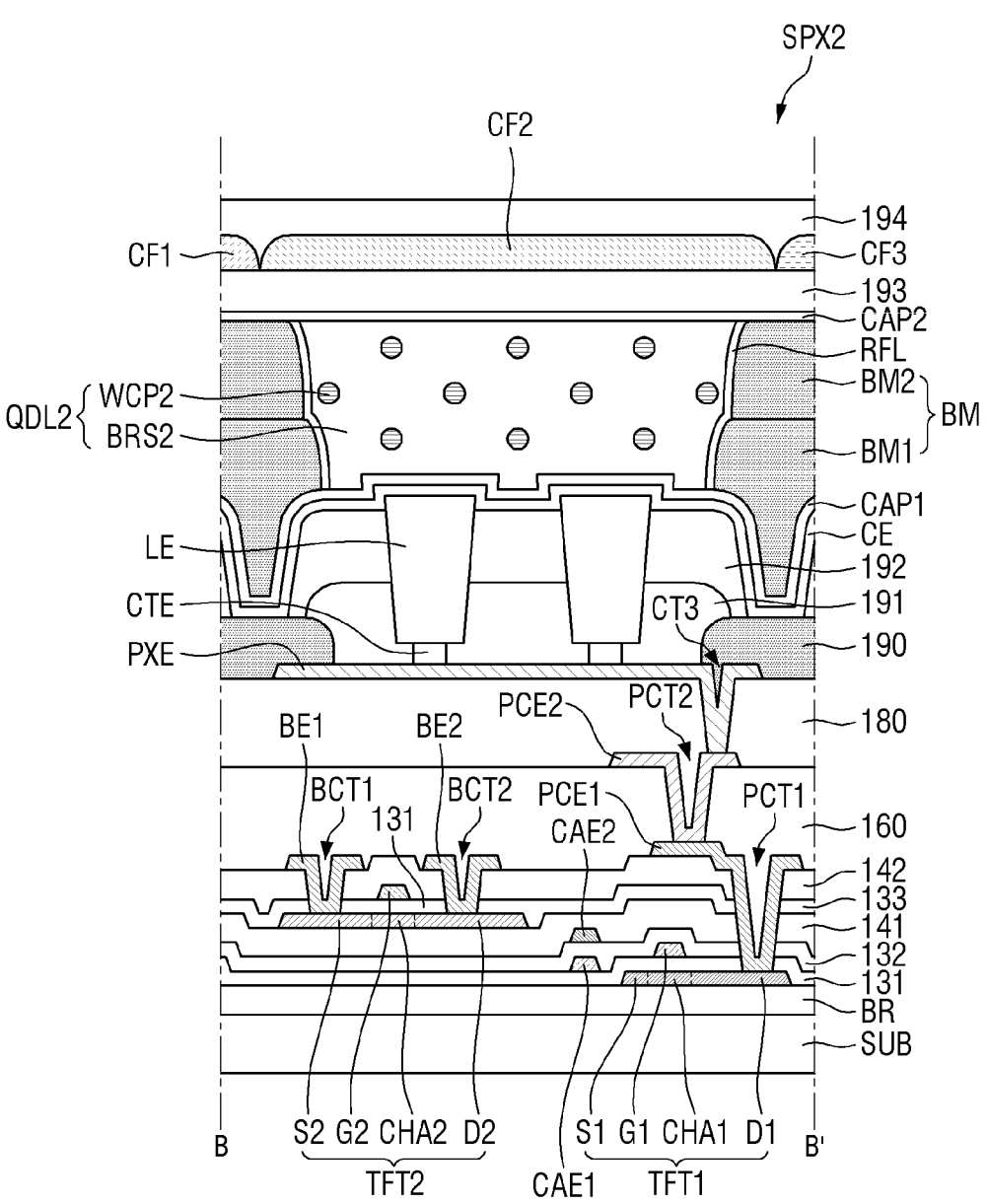
FIG. 7 is a schematic cross-sectional view illustrating an example of the display device taken along line B-B' of FIG. 5.
Figure 8:
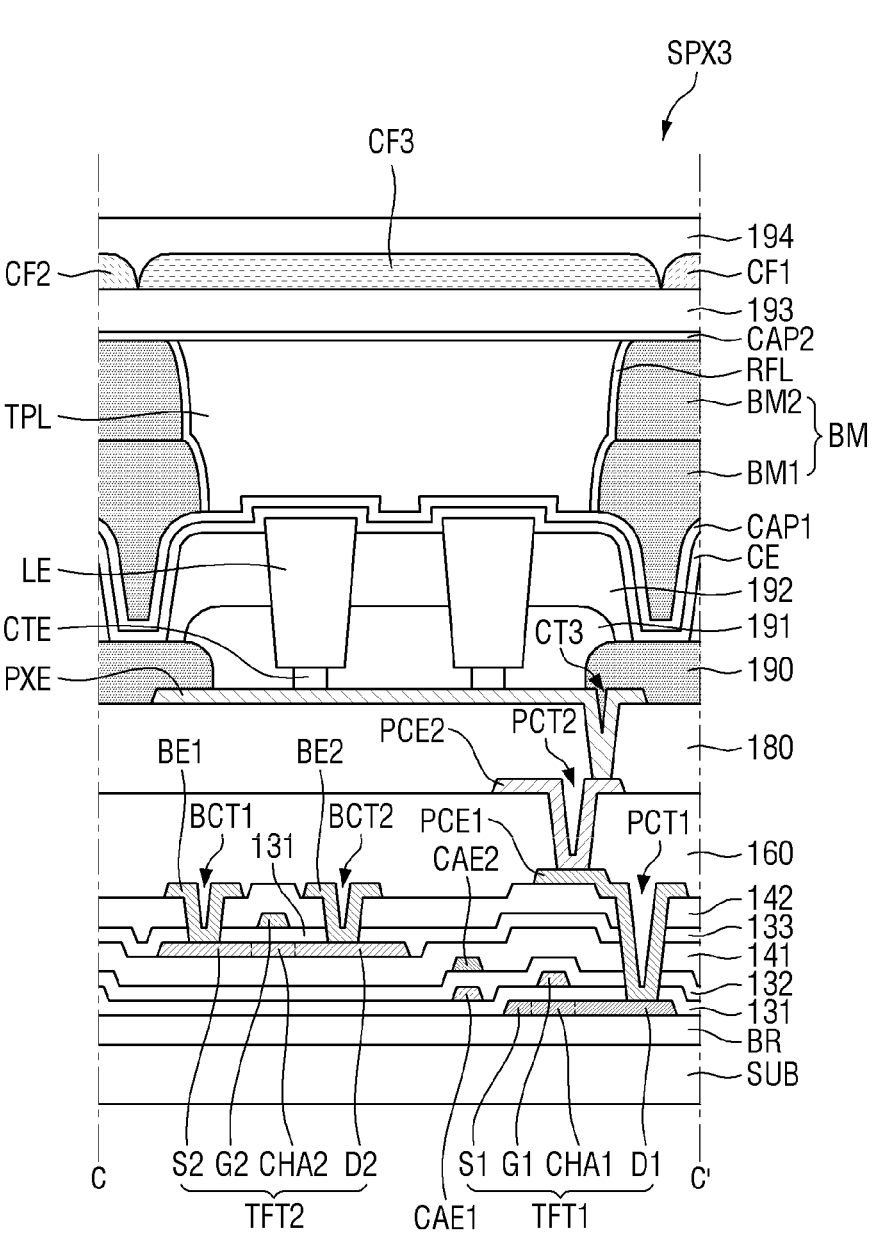
FIG. 8 is a schematic cross-sectional view illustrating an example of the display device taken along line C-C' of FIG. 5.
Figure 9:
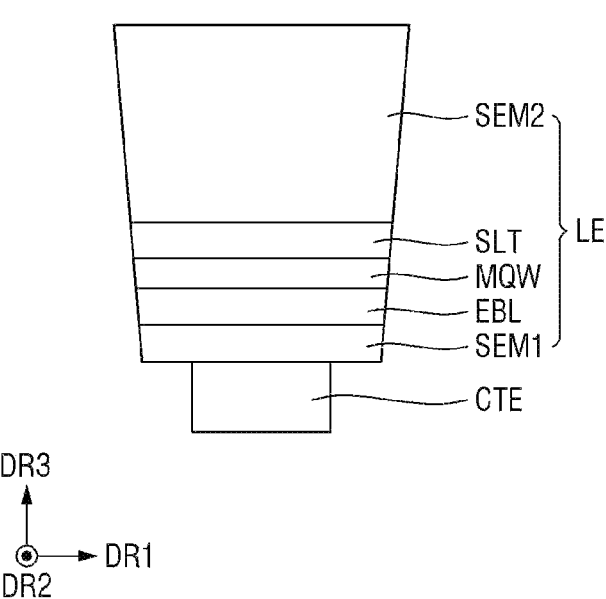
FIG. 9 is a schematic cross-sectional view illustrating a light emitting element of FIGS. 4 to 6 in detail.

FIG. 6 is a schematic cross-sectional view illustrating an example of the display device taken along line A-A' of FIG. 5. FIG. 7 is a schematic cross-sectional view illustrating an example of the display device taken along line B-B' of FIG. 5. FIG. 8 is a schematic cross-sectional view illustrating an example of the display device taken along line C-C' of FIG. 5. FIG. 9 is a schematic cross-sectional view illustrating a light emitting element of FIGS. 4 to 6 in detail.

Referring to FIGS. 6 to 9, a substrate SUB may be made of an insulating material such as glass or a polymer resin. In case that the substrate SUB is made of the polymer resin, the substrate may be a stretchable flexible substrate. The polymer resin may be an acrylic resin, an epoxy resin, a phenolic resin, a polyamide resin, a polyimide resin, or the like within the spirit and the scope of the disclosure.

A barrier film BR may be disposed on the substrate SUB. The substrate SUB may be made of an insulating material such as a polymer resin. For example, the substrate SUB may be made of polyimide. The substrate SUB may be a flexible substrate that may be bent, folded, and rolled.

The barrier film BR is a film for protecting transistors of a thin film transistor layer TFTL from moisture permeating through the substrate SUB vulnerable to moisture permeation. The barrier film BR may include inorganic films that may be alternately stacked each other. For example, the barrier film BR may be formed as multiple films in which one or more inorganic films of a silicon nitride layer, a silicon oxynitride layer, a silicon oxide layer, a titanium oxide layer, and an aluminum oxide layer may be alternately stacked each other.

First thin film transistors TFT1 may be disposed on the barrier film BR. The first thin film transistor TFT1 may be any one of the fourth transistor ST4 and the sixth transistor ST6 illustrated in FIG. 4. The first thin film transistor TFT1 may include a first active layer ACT1 and a first gate electrode G1.

The first active layer ACT1 of the first thin film transistor TFT1 may be disposed on the barrier film BR. The first active layer ACT1 of the first thin film transistor TFT1 may include polycrystalline silicon, single crystal silicon, low-temperature polycrystalline silicon, or amorphous silicon.

The first active layer ACT1 may include a first channel region CHA1, a first source region S1, and a first drain region D1. The first channel region CHA1 may be a region overlapping the first gate electrode G1 in the third direction DR3, which is a thickness direction of the substrate SUB. The first source region S1 may be disposed on one side or a side of the first channel region CHA1, and the first drain region D1 may be disposed on the other side of the first channel region CHA1. The first source region S1 and the first drain region D1 may be regions that do not overlap the first gate electrode G1 in the third direction DR3. The first source region S1 and the first drain region D1 may be regions having conductivity by doping a silicon semiconductor or an oxide semiconductor with ions.

A first gate insulating film 131 may be disposed on the first active layer ACT1 of the first thin film transistor TFT1. The first gate insulating film 131 may be formed as an inorganic film such as a silicon nitride layer, a silicon oxynitride layer, a silicon oxide layer, a titanium oxide layer, or an aluminum oxide layer.

A first gate metal layer GTL1 may be disposed on the first gate insulating film 131. The first gate metal layer GTL1 may include the first gate electrode G1 of the first thin film transistor TFT1 and a first capacitor electrode CAE1. The first gate electrode G1 may overlap the first active layer ACT1 in the third direction DR3. It has been illustrated in FIGS. 6 to 8 that the first gate electrode G1 and the first capacitor electrode CAE1 are disposed to be spaced apart from each other, but the first gate electrode G1 and the first capacitor electrode CAE1 may be connected to each other. The first gate metal layer GTL1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second gate insulating film 132 may be disposed on the first gate electrode G1 of the first thin film transistor TFT1 and the first capacitor electrode CAE1. The second gate insulating film 132 may be formed as an inorganic film such as a silicon nitride layer, a silicon oxynitride layer, a silicon oxide layer, a titanium oxide layer, or an aluminum oxide layer.

A second gate metal layer GTL2 may be disposed on the second gate insulating film 132. The second gate metal layer GTL2 may include a second capacitor electrode CAE2. The second capacitor electrode CAE2 may overlap the first capacitor electrode CAE1 in the third direction DR3. Since the second gate insulating film 132 has a selectable dielectric constant, a capacitor C1 (see FIG. 4) may be formed by the first capacitor electrode CAE1, the second capacitor electrode CAE2, and the second gate insulating film 132 disposed between the first capacitor electrode CAE1 and the second capacitor electrode CAE2. The second gate metal layer GTL2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first interlayer insulating film 141 may be disposed on the second capacitor electrode CAE2. The first interlayer insulating film 141 may be formed as an inorganic film such as a silicon nitride layer, a silicon oxynitride layer, a silicon oxide layer, a titanium oxide layer, or an aluminum oxide layer.

Second thin film transistors TFT2 may be disposed on the first interlayer insulating film 141. The second thin film transistor TFT2 may be any one of the first transistor ST1 and the third transistor ST3 illustrated in FIG. 4. The second thin film transistor TFT2 may include a second active layer ACT2 and a second gate electrode G2.

The second active layer ACT2 of the second thin film transistor TFT2 may be disposed on the first interlayer insulating film 141. The second active layer ACT2 may include an oxide semiconductor. For example, the second active layer ACT2 may include IGZO (indium (In), gallium (Ga), zinc (Zn), and oxygen (O)), IGZTO (indium (In), gallium (Ga), zinc (Zn), tin (Sn), and oxygen (O)), or IGTO (indium (In), gallium (Ga), tin (Sn) and oxygen (O)).

The second active layer ACT2 may include a second channel region CHA2, a second source region S2, and a second drain region D2. The second channel region CHA2 may be a region overlapping the second gate electrode G2 in the third direction DR3. The second source region S2 may be disposed on one side or a side of the second channel region CHA2, and the second drain region D2 may be disposed on the other side of the second channel region CHA2. The second source region S2 and the second drain region D2 may be regions that do not overlap the second gate electrode G2 in the third direction DR3. The second source region S2 and the second drain region D2 may be regions having conductivity by doping an oxide semiconductor with ions.

A third gate insulating film 133 may be disposed on the second active layer ACT2 of the second thin film transistor TFT2. The third gate insulating film 133 may be formed as an inorganic film such as a silicon nitride layer, a silicon oxynitride layer, a silicon oxide layer, a titanium oxide layer, or an aluminum oxide layer.

A third gate metal layer GTL3 may be disposed on the third gate insulating film 133. The third gate metal layer GTL3 may include the second gate electrode G2 of the second thin film transistor TFT2. The second gate electrode G2 may overlap the second active layer ACT2 in the third direction DR3. The third gate metal layer GTL3 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second interlayer insulating film 142 may be disposed on the second gate electrode G2 of the second thin film transistor TFT2. The second interlayer insulating film 142 may be formed as an inorganic film such as a silicon nitride layer, a silicon oxynitride layer, a silicon oxide layer, a titanium oxide layer, or an aluminum oxide layer.

A first data metal layer DTL1 may be disposed on the second interlayer insulating film 142. The first data metal layer DTL1 may include a first pixel connection electrode PGE1, a first connection electrode BE1, and a second connection electrode BE2. The first pixel connection electrode PCE1 may be connected to the first drain region D1 of the first active layer ACT1 through a first pixel connection hole PCT1 penetrating through the first gate insulating film 131, the second gate insulating film 132, the first interlayer insulating film 141, the third gate insulating film 133, and the second interlayer insulating film 142. The first connection electrode BE1 may be connected to the second source region S2 of the second active layer ACT2 through a first connection contact hole BCT1 penetrating through the second interlayer insulating film 142. The second connection electrode BE2 may be connected to the second drain region D2 of the second active layer ACT2 through a second connection contact hole BCT2 penetrating through the second interlayer insulating film 142. The first data metal layer DTL1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. For example, the first data metal layer DTL1 may include a first layer made of titanium (Ti), a second layer made of aluminum (Al), and a third layer made of titanium (Ti).

A first organic film 160 for planarizing a step a step due to the first thin film transistor TFT1 and the second thin film transistor TFT2 may be disposed on the first pixel connection electrode PCE1, the first connection electrode BE1, and the second connection electrode BE2. The first organic film 160 may be formed as an organic film made of an acrylic resin, an epoxy resin, a phenolic resin, a polyamide resin, a polyimide resin, or the like within the spirit and the scope of the disclosure.

A second data metal layer DTL2 may be disposed on the first organic film 160. The second data metal layer DTL2 may include a second pixel connection electrode PCE2. The second pixel connection electrode PCE2 may be connected to the first pixel connection electrode PCE1 through a second pixel connection hole PCT2 penetrating through the first organic film 160. The second data metal layer DTL2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. For example, the second data metal layer DTL2 may include a first layer made of titanium (Ti), a second layer made of aluminum (Al), and a third layer made of titanium (Ti).

A second organic film 180 may be disposed on the second pixel connection electrode PCE2. The second organic film 180 may be formed as an organic film made of an acrylic resin, an epoxy resin, a phenolic resin, a polyamide resin, a polyimide resin, or the like within the spirit and the scope of the disclosure.

The light emitting element layer EML may be disposed on the second organic film 180. The light emitting element layer EML may include pixel electrodes PXE, light emitting elements LE1, LE2, and LE3, a common electrode CE, and third and fourth organic films 191, 192.

A pixel electrode layer PXL may be disposed on the second organic film 180. The pixel electrode layer PXL may include the pixel electrodes PXE. Each of the pixel electrodes PXE may be connected to the second pixel connection electrode PCE2 through a third pixel connection hole CT3 penetrating through the second organic film 180. For this reason, each of the pixel electrodes PXE may be connected to the source region S1 or the drain region D1 of the thin film transistor TFT1 through the first pixel connection electrode PGE1 and the second pixel connection electrode PCE2. Therefore, a pixel voltage or an anode voltage controlled by the thin film transistor TFT1 may be applied to the pixel electrode PXE.

The pixel electrode layer PXL may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. Since the pixel electrodes PXE serve to be bonded to a first light emitting element LE1, a second light emitting element LE2, or a third light emitting element LE3, it may be considered to lower sheet resistances of the pixel electrodes PXE in order to reduce a contact resistance between the pixel electrode PXE and the first light emitting element LE1, the second light emitting element LE2, or the third light emitting element LE3. For example, the pixel electrode layer PXL may be made of copper (Cu) having a low sheet resistance.

A bank 190 may be disposed to cover an edge of the pixel electrode PXE. The bank 190 may be formed as an organic film made of an acrylic resin, an epoxy resin, a phenolic resin, a polyamide resin, a polyimide resin, or the like within the spirit and the scope of the disclosure. The bank 190 may include a light blocking material in order to prevent light of light emitting elements LE of any one sub-pixel from propagating to sub-pixels adjacent to any one sub-pixel. For example, the bank 190 may include an inorganic black pigment such as carbon black or an organic black pigment.

The light emitting elements LE may be disposed on the pixel electrode PXE exposed without being covered by the bank 190. It has been illustrated that each of the light emitting elements LE is a vertical micro LED extending in the third direction DR3. Each of the light emitting elements LE may have a reverse tapered shape in cross section. For example, each of the light emitting elements LE may have a trapezoidal shape of which a width of an upper surface is greater than a width of a lower surface in cross section.

Each of the light emitting elements LE may be made of an inorganic material such as GaN. Each of lengths of the light emitting elements LE in the first direction DR1, the second direction DR2, and the third direction DR3 may be several to several hundreds of micrometers. For example, each of lengths of the light emitting elements LE in the first direction DR1, the second direction DR2, and the third direction DR3 may be about 100 μm or less.

Each of the light emitting elements LE may be grown and formed on a semiconductor substrate such as a silicon wafer. Each of the light emitting elements LE may be directly transferred from the semiconductor substrate onto the pixel electrode PXE of the substrate SUB. By way of example, each of the light emitting elements LE may be transferred onto the pixel electrode PXE of the substrate SUB through an electrostatic method using an electrostatic head or a stamp method using an elastic polymer material such as polydimethylsiloxane (PDMS) or silicon as a material of a transfer substrate.

Each of the light emitting elements LE may include a first semiconductor layer SEM1, an electron blocking layer EBL, an active layer MQW, a superlattice layer SLT, and a second semiconductor layer SEM2, as illustrated in FIG. 9.

A contact electrode CTE may be disposed on the pixel electrode PXE. The contact electrode CTE and the pixel electrode PXE may be melt-bonded to each other by heat and pressure. By way of example, the contact electrode CTE and the pixel electrode PXE may be bonded to each other through a conductive adhesive member such as an anisotropic conductive film (ACF) or an anisotropic conductive paste (ACP). By way of example, the contact electrode CTE and the pixel electrode PXE may be bonded to each other through a soldering process. For example, the contact electrode CTE may include at least one of gold (Au), copper (Cu), aluminum (Al), and tin (Sn).

The first semiconductor layer SEM1 may be disposed on the contact electrode CTE. The first semiconductor layer SEM1 may be made of GaN doped with a first conductivity-type dopant such as Mg, Zn, Ca, Se, or Ba.

The electron blocking layer EBL may be disposed on the first semiconductor layer SEM1. The electron blocking layer EBL may be a layer for suppressing or preventing too many electrons from flowing to the active layer MQW. For example, the electron blocking layer EBL may be made of AlGaN or p-AlGaN doped with p-type Mg. The electron blocking layer EBL may be omitted.

The active layer MQW may be disposed on the electron blocking layer EBL. The active layer MQW may emit light by a combination of electron-hole pairs according to electrical signals applied through the first semiconductor layer SEM1 and the second semiconductor layer SEM2.

The active layer MQW may include a material having a single or multiple quantum well structure. In case that the active layer MQW may include the material having the multiple quantum well structure, the active layer MQW may have a structure in which well layers and barrier layers may be alternately stacked each other. The well layer may be made of InGaN, and the barrier layer may be made of GaN or AlGaN, but the disclosure is not limited thereto. By way of example, the active layer MQW may have a structure in which semiconductor materials having large band gap energy and semiconductor materials having small band gap energy may be alternately stacked each other, and may include other Group III to Group V semiconductor materials depending on a wavelength band of emitted light.

In case that the active layer MQW may include InGaN, a color of the light emitted by the active layer MQW may change depending on a content of indium (In). For example, as the content of indium (In) increases, a wavelength band of the light emitted by the active layer may move to a red wavelength band, and as the content of indium (In) decreases, a wavelength band of the light emitted by the active layer may move to a blue wavelength band. For example, the content of indium (In) in the active layer MQW of the light emitting element LE emitting the light of the blue wavelength band may be about 10 wt % to about 20 wt %.

The superlattice layer SLT may be disposed on the active layer MQW. The superlattice layer SLT may be a layer for alleviating stress between the second semiconductor layer SEM2 and the active layer MQW. For example, the superlattice layer SLT may be made of InGaN or GaN. The superlattice layer SLT may be omitted.

The second semiconductor layer SEM2 may be disposed on the superlattice layer SLT. The second semiconductor layer SEM2 may be doped with a second conductivity-type dopant such as Si, Ge, or Sn. For example, the second semiconductor layer SEM2 may be made of n-GaN doped with n-type Si.

A third organic film 191 may be disposed on the pixel electrode PXE that is not covered by the bank 190 and the light emitting elements LE. The third organic film 191 may be disposed to cover side surfaces and a portion of an upper surface of the bank 190. A height of the third organic film 191 may be greater than a height of the bank 190. The third organic film 191 may be disposed on portions of side surfaces of each of the light emitting elements LE. A height of the third organic film 191 may be smaller than a height of each of the light emitting elements LE. The third organic film 191 may be formed as an organic film made of an acrylic resin, an epoxy resin, a phenolic resin, a polyamide resin, a polyimide resin, or the like within the spirit and the scope of the disclosure.

A fourth organic film 192 may be disposed on the third organic film 191. The fourth organic film 192 may be disposed on portions of the side surfaces of each of the light emitting elements LE. The sum of the height of the third organic film 191 and a height of the fourth organic film 192 may be smaller than the height of each of the light emitting elements LE. The fourth organic film 192 may be formed as an organic film made of an acrylic resin, an epoxy resin, a phenolic resin, a polyamide resin, a polyimide resin, or the like within the spirit and the scope of the disclosure.

The third organic film 191 and the fourth organic film 192 are layers for planarizing a step caused by the light emitting elements LE. In case that the height of each of the light emitting elements LE is similar to that of the third organic film 191, the fourth organic film 192 may be omitted.

The common electrode CE may be disposed on an upper surface of each of the light emitting elements LE and an upper surface of the fourth organic film 192. The common electrode CE may be disposed on the bank 190 exposed without being covered by the third organic film 191 and the fourth organic film 192. The common electrode CE may be a common layer formed in common in the first sub-pixel SPX1, the second sub-pixel SPX2, and the third sub-pixel SPX3. The common electrode CE may be made of transparent conductive oxide (TCO) such as indium tin oxide (ITO) or indium zinc oxide (IZO) capable of transmitting light therethrough.

The pixel electrode PXE may be referred to as an anode electrode, and the common electrode CE may be referred to as a cathode electrode.

A first capping layer CAP1 may be disposed on the common electrode CE. The first capping layer CAP1 may be formed as an inorganic film such as a silicon nitride layer, a silicon oxynitride layer, a silicon oxide layer, a titanium oxide layer, or an aluminum oxide layer.

A light blocking layer BM, a first light conversion layer QDL1, a second light conversion layer QDL2, and a light transmission layer TPL may be disposed on the first capping layer CAP1. The first light conversion layer QDL1, the second light conversion layer QDL2, and the light transmission layer TPL may be formed by partition of the light blocking layer BM. Therefore, the first light conversion layer QDL1 may be disposed on the first capping layer CAP1 in the first sub-pixel SPX1, the second light conversion layer QDL2 may be disposed on the first capping layer CAP1 in the second sub-pixel SPX2, and the light transmission layer TPL may be disposed on the first capping layer CAP1 in the third sub-pixel SPX3. The light blocking layer BM may overlap the bank 190 and may not overlap the light emitting elements LE, in the third direction DR3.

The first light conversion layer QDL1 may convert some of light of a blue wavelength band incident from the light emitting elements LE into light of a red wavelength band. The first light conversion layer QDL1 may include a first base resin BRS1 and first wavelength conversion particles WCP1. The first base resin BRS1 may include a light-transmitting organic material. For example, the first base resin BRS1 may include an epoxy-based resin, an acrylic resin, a cardo-based resin, an imide-based resin, or the like within the spirit and the scope of the disclosure. The first wavelength conversion particle WCP1 may convert some of the light of the blue wavelength band incident from the light emitting elements LE into the light of the red wavelength band. The first wavelength conversion particle WCP1 may be a quantum dot (QD), a quantum rod, a fluorescent material, or a phosphorescent material.

The second light conversion layer QDL2 may convert some of light of a blue wavelength band incident from the light emitting elements LE into light of a green wavelength band. The second light conversion layer QDL2 may include a second base resin BRS2 and second wavelength conversion particles WCP2. The second base resin BRS2 may include a light-transmitting organic material. For example, the second base resin BRS2 may include an epoxy-based resin, an acrylic resin, a cardo-based resin, an imide-based resin, or the like within the spirit and the scope of the disclosure. The second wavelength conversion particle WCP2 may convert some of the light of the blue wavelength band incident from the light emitting elements LE into the light of the green wavelength band. The second wavelength conversion particle WCP2 may be a quantum dot (QD), a quantum rod, a fluorescent material, or a phosphorescent material.

The light transmission layer TPL may include a light-transmitting organic material. For example, the light transmission layer TPL may include an epoxy-based resin, an acrylic resin, a cardo-based resin, an imide-based resin, or the like within the spirit and the scope of the disclosure.

The light blocking layer BM may include a first light blocking layer BM1 and a second light blocking layer BM2 that may be sequentially stacked each other. A length of the first light blocking layer BM1 in the first direction DR1 or a length of the first light blocking layer BM1 in the second direction DR2 may be greater than a length of the second light blocking layer BM2 in the first direction DR1 or a length of the second light blocking layer BM2 in the second direction DR2. Each of the first light blocking layer BM1 and the second light blocking layer BM2 may be formed as an organic film made of an acrylic resin, an epoxy resin, a phenolic resin, a polyamide resin, a polyimide resin, or the like within the spirit and the scope of the disclosure. The first light blocking layer BM1 and the second light blocking layer BM2 may include a light blocking material in order to prevent light of light emitting elements LE of any one sub-pixel from propagating to sub-pixels adjacent to any one sub-pixel. For example, the first light blocking layer BM1 and the second light blocking layer BM2 may include an inorganic black pigment such as carbon black or an organic black pigment.

A reflective film RFL may be disposed between the light blocking layer BM and the first light conversion layer QDL1, between the light blocking layer BM and the second light conversion layer QDL2, and between the light blocking layer BM and the light transmission layer TPL. The reflective film RFL may include a metal material having high reflectivity, such as aluminum (Al). A thickness of the reflective film RFL may be about 0.1 μm. The reflective film RFL serves to reflect light traveling from the first wavelength converting layer QDL1, the second wavelength converting layer QDL2, and the light transmission layer TPL in a lateral direction rather than an upward direction.

A second capping layer CAP2 may be disposed on the light blocking layer BM, the first light conversion layer QDL1, the second light conversion layer QDL2, and the light transmission layer TPL. The second capping layer CAP2 may be formed as an inorganic film such as a silicon nitride layer, a silicon oxynitride layer, a silicon oxide layer, a titanium oxide layer, or an aluminum oxide layer. The light blocking layer BM, the first light conversion layer QDL1, the second light conversion layer QDL2, and the light transmission layer TPL may be encapsulated by the first capping layer CAP1 and the second capping layer CAP2.

A fifth organic film 193 may be disposed on the second capping layer CAP2. The fifth organic film 193 may be made of an acrylic resin, an epoxy resin, a phenolic resin, a polyamide resin, a polyimide resin, or the like within the spirit and the scope of the disclosure.

Color filters CF1, CF2, and CF3 may be disposed on the fifth organic film 193. The color filters CF1, CF2, and CF3 may include first color filters CF1, second color filters CF2, and third color filters CF3.

Each of the first color filters CF1 disposed in the first sub-pixels SPX1 may transmit light of a red wavelength band therethrough and absorb or block light of a blue wavelength band. Therefore, each of the first color filters CF1 may transmit the light of the red wavelength band converted by the first light conversion layer QDL1 among the light of the blue wavelength band emitted from the light emitting elements LE therethrough, and absorb or block the light of the blue wavelength band that is not converted by the first light conversion layer QDL1. Accordingly, the first sub-pixel SPX1 may emit the light of the red wavelength band.

Each of the second color filters CF2 disposed in the second sub-pixels SPX2 may transmit light of a green wavelength band therethrough and absorb or block light of a blue wavelength band. Therefore, each of the second color filters CF2 may transmit the light of the green wavelength band converted by the first light conversion layer QDL1 among the light of the blue wavelength band emitted from the light emitting elements LE therethrough, and absorb or block the light of the blue wavelength band that is not converted by the first light conversion layer QDL1. Accordingly, the second sub-pixel SPX2 may emit the light of the green wavelength band.

Each of the third color filters CF3 disposed in the third sub-pixels SPX3 may transmit light of a blue wavelength band therethrough. Therefore, each of the third color filters CF3 may transmit the light of the blue wavelength band emitted from the light emitting elements LE and passing through the light transmission layer TPL therethrough. Accordingly, the third sub-pixel SPX3 may emit the light of the blue wavelength band.

A sixth organic film 194 for planarization may be disposed on the color filters CF1, CF2, and CF3. The sixth organic film 194 may be made of an acrylic resin, an epoxy resin, a phenolic resin, a polyamide resin, a polyimide resin, or the like within the spirit and the scope of the disclosure.

Figure 10:
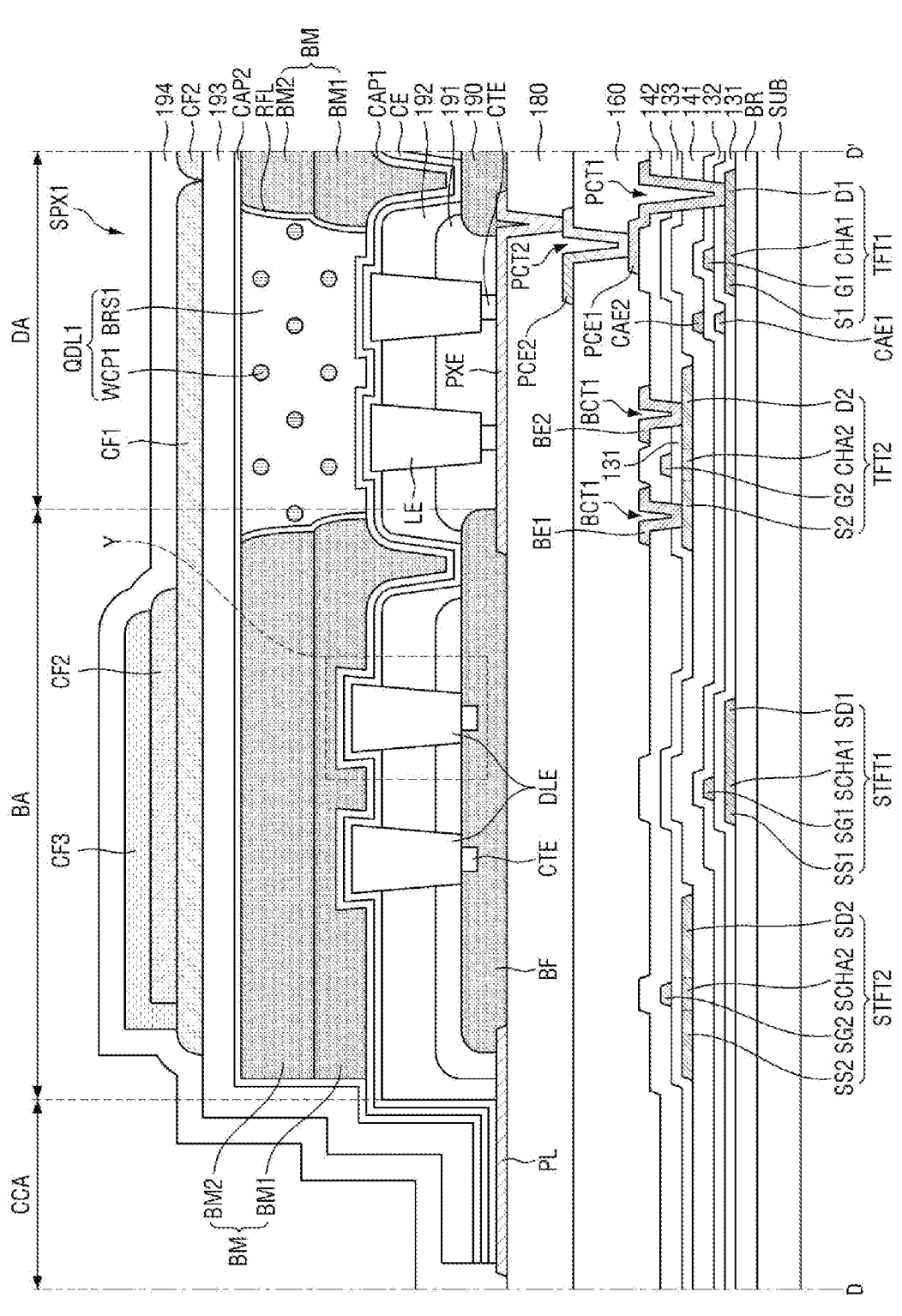
FIG. 10 is a schematic cross-sectional view illustrating an example of the display device taken along line D-D' of FIG. 2.
Figure 11:
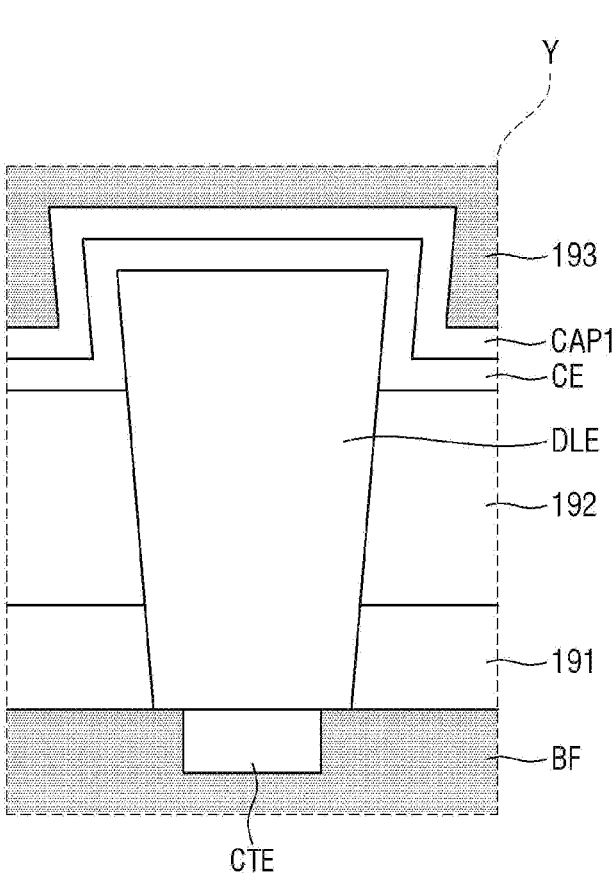
FIG. 11 is a schematic cross-sectional view illustrating area Y of FIG. 10 in detail.

FIG. 10 is a schematic cross-sectional view illustrating an example of the display device taken along line D-D' of FIG. 2. FIG. 11 is a schematic cross-sectional view illustrating area Y of FIG. 10 in detail. In FIG. 10, the buffer area BA disposed outside the display area DA and the common connection area CEL disposed outside the buffer area BA are illustrated.

Referring to FIGS. 10 and 11, a buffer BF may be disposed on the second organic film 180. The buffer BF may be disposed to cover one edge or an edge of the pixel electrode PXE of the sub-pixel SPX1 disposed at an edge of the display area DA. The buffer BF may be disposed to cover one edge or an edge of a power line PL disposed in the common connection area CEL.

The buffer BF may be formed as an organic film made of an acrylic resin, an epoxy resin, a phenolic resin, a polyamide resin, a polyimide resin, or the like within the spirit and the scope of the disclosure. The buffer BF may include a light blocking material, for example, an inorganic black pigment such as carbon black or an organic black pigment. The bank 190 and the buffer BF may be disposed on the second organic film 180 and be formed by a single manufacturing process, and may thus include the same organic material or a similar organic material.

The light emitting elements LE may be bonded to an area wider than the display area DA in consideration of attachment errors in manufacturing processes of the display device 10, and accordingly, some or a number of light emitting elements DLE of the light emitting elements LE may be bonded to the non-display area NDA. In case that the buffer BF made of the organic material is disposed in the buffer area BA adjacent to the display area DA, the light emitting elements DLE bonded to the non-display area NDA may be stuck and fixed to the buffer BF. For example, since dummy light emitting elements DLE unintentionally disposed in the non-display area NDA may be fixed by the buffer BF, it is possible to prevent the dummy light emitting elements DLE disposed in the non-display area NDA from being short-circuited to lines or electrodes. It is possible to prevent contamination of a manufacturing line due to falling-off of the dummy light emitting elements DLE unintentionally disposed in the non-display area NDA during the manufacturing processes.

As illustrated in FIG. 11, each of dummy light emitting elements DLE may be stuck and fixed to the buffer BF. A lower portion of each of the dummy light emitting elements DLE may be inserted into the buffer BF. Lower portions of side surfaces of each of the dummy light emitting elements DLE may be surrounded by the buffer BF.

Each of the dummy light emitting elements DLE may have a reverse tapered shape in cross section. For example, each of the dummy light emitting elements DLE may have a trapezoidal shape of which a width of an upper surface is greater than a width of a lower surface in cross section.

A structure of the dummy light emitting element DLE may be substantially the same as that of the light emitting element LE illustrated in FIG. 9, and a description of the structure of the dummy light emitting element DLE will thus be omitted.

The third organic film 191 may be disposed on the buffer BF that is not covered by each of the dummy light emitting elements DLE. The third organic film 191 may be disposed on portions of the side surfaces of each of the dummy light emitting elements DLE. A height of the third organic film 191 may be smaller than a height of each of the dummy light emitting elements DLE.

The fourth organic film 192 may be disposed on portions of the side surfaces of each of the dummy light emitting elements DLE. The sum of the height of the third organic film 191 and a height of the fourth organic film 192 may be smaller than the height of each of the dummy light emitting elements DLE.

The common electrode CE may be disposed on an upper surface of each of the dummy light emitting elements DLE. The common electrode CE may extend to the common connection area CEL through the buffer area BA. The common electrode CE may be connected to the power line PL exposed without being covered by the buffer BF, the third organic film 191, and the fourth organic film 192 in the common connection area CEL.

In the buffer area BA, the first light blocking layer BM1 may be disposed on the first capping layer CAP1, and the second light blocking layer BM2 may be disposed on the first light blocking layer BM1. The first light blocking layer BM1 and the second light blocking layer BM2 may overlap the buffer BF in the third direction DR3. Due to the first light blocking layer BM1 and the second light blocking layer BM2, it is possible to prevent light of the dummy light emitting elements DLE from being emitted to the outside even though the dummy light emitting elements DLE disposed in the non-display area NDA are short-circuited to the lines or the electrodes to emit the light.

The first color filter CF1, the second color filter CF2, and the third color filter CF3 may be sequentially stacked each other on the sixth organic film 194 in the buffer area BA. A stacked structure of the first color filter CF1, the second color filter CF2, and the third color filter CF3 plays the same role as the light blocking layer. Therefore, due to the stacked structure of the first color filter CF1, the second color filter CF2, and the third color filter CF3 in the buffer area BA, it is possible to completely prevent the light of the dummy light emitting elements DLE from being emitted to the outside even though the dummy light emitting elements DLE disposed in the non-display area NDA are short-circuited to the lines or the electrodes to emit the light.

As illustrated in FIGS. 10 and 11, by disposing the buffer BF made of the organic material in the buffer area BA adjacent to the display area DA, the light emitting elements DLE bonded to the non-display area NDA may be stuck and fixed to the buffer BF. For example, since dummy light emitting elements DLE unintentionally disposed in the non-display area NDA may be fixed by the buffer BF, it is possible to prevent the dummy light emitting elements DLE disposed in the non-display area NDA from being short-circuited to the lines or the electrodes. It is possible to prevent contamination of a manufacturing line due to falling-off of the dummy light emitting elements DLE unintentionally disposed in the non-display area NDA during the manufacturing processes.

Due to a stacked structure of the first light blocking layer BM1, the second light blocking layer BM2, the first color filter CF1, the second color filter CF2, and the third color filter CF3 in the buffer area BA, it is possible to prevent the light of the dummy light emitting elements DLE from being emitted to the outside even though the dummy light emitting elements DLE disposed in the non-display area NDA are short-circuited to the lines or the electrodes to emit the light.

Further, a scan driver which is disposed in the buffer area includes first scan transistors STFT1 and second scan transistors STFT2. Each of the first scan transistors STFT1 may include a first scan gate electrode SG1, a first scan channel region SCHA1, a first scan source region SS1, and a first scan drain region SD1. Each of the second scan transistors STFT2 may include a second scan gate electrode SG2, a second scan channel region SCHA2, a second scan source region SS2, and a second scan drain region SD2.

The first active layer ACT1 may include the first scan channel region SCHA1, the first scan source region SS1, and the first scan drain region SD1. Also, the first gate metal layer GTL1 may include the first scan gate electrode SG1. The second active layer ACT2 may include the second scan channel region SCHA2, the second scan source region SS2, and the second scan drain region SD2. Also, the third gate metal layer GTL3 may include the second scan gate electrode SG2.

Figure 12:
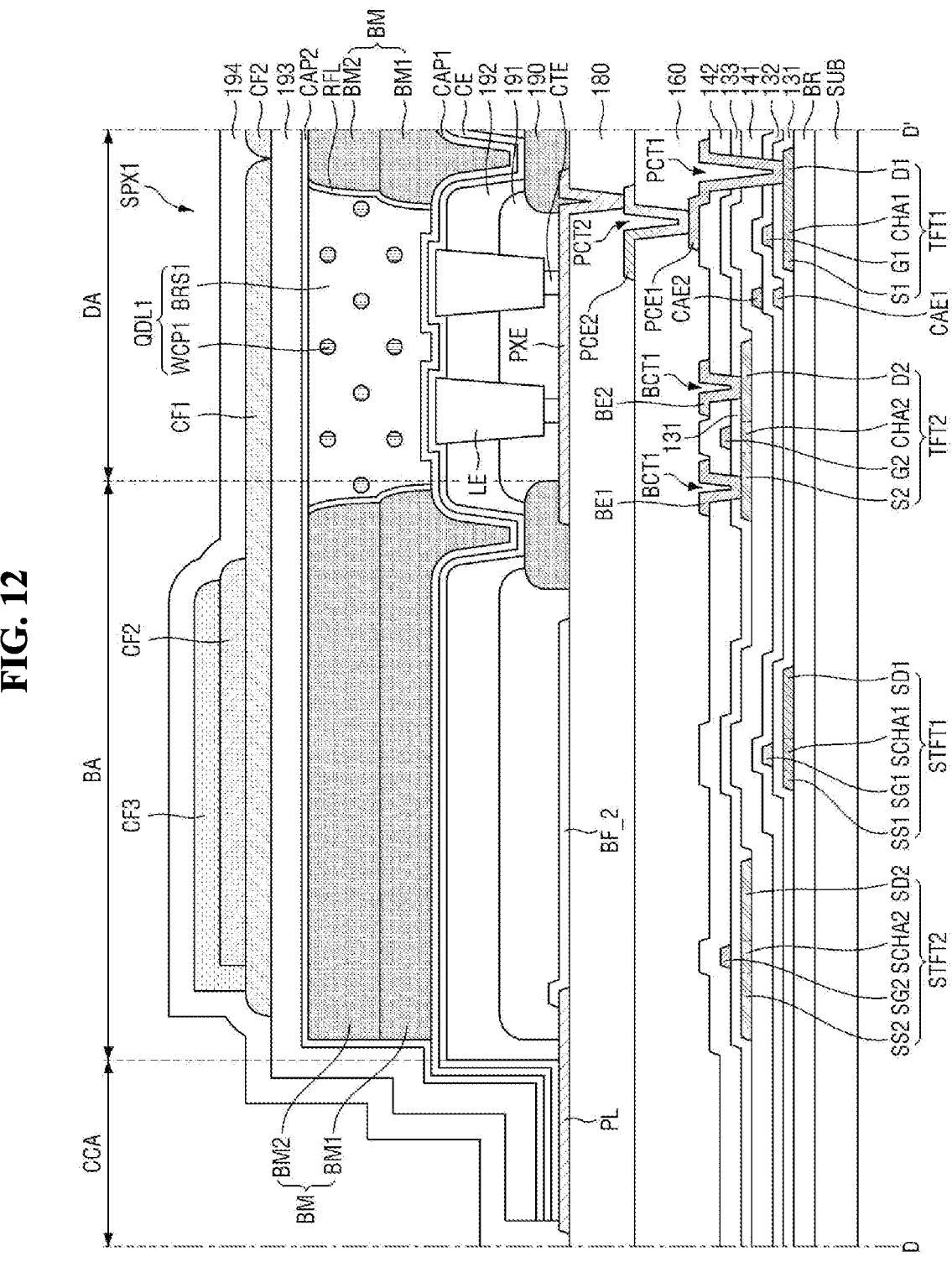
FIG. 12 is a schematic cross-sectional view illustrating another example of the display device taken along line D-D' of FIG. 2.

FIG. 12 is a schematic cross-sectional view illustrating another example of the display device taken along line D-D' of FIG. 2.

An embodiment of FIG. 12 is different from an embodiment of FIG. 10 in that a buffer BF_2 may include an inorganic material. In FIG. 12, a description of contents overlapping those of an embodiment of FIG. 10 will be omitted.

Referring to FIG. 12, the buffer BF_2 may be formed as an inorganic film such as a silicon nitride layer, a silicon oxynitride layer, a silicon oxide layer, a titanium oxide layer, or an aluminum oxide layer. A thickness of the buffer BF_2 may be smaller than a thickness of the bank 190. One end or an end of the buffer BF_2 may cover one end or an end of the power line PL, but an embodiment is not limited thereto.

The contact electrode CTE of each of the light emitting elements LE and the pixel electrode PXE may be connected to each other by melt-bonding, adhering through a conductive adhesive member, or soldering bonding, but in case that the buffer BF_2 is formed as the inorganic film such as the silicon nitride layer, the silicon oxynitride layer, the silicon oxide layer, the titanium oxide layer, or the aluminum oxide layer, contact electrodes CTE of the dummy light emitting elements DLE disposed in the non-display area NDA are not bonded to the buffer BF_2 by a bonding process, and thus, the dummy light emitting elements DLE may fall off. Therefore, in case that the buffer BF_2 is formed as the inorganic film, it is possible to prevent the dummy light emitting elements DLE from being disposed in the non-display area NDA.

Figure 13:
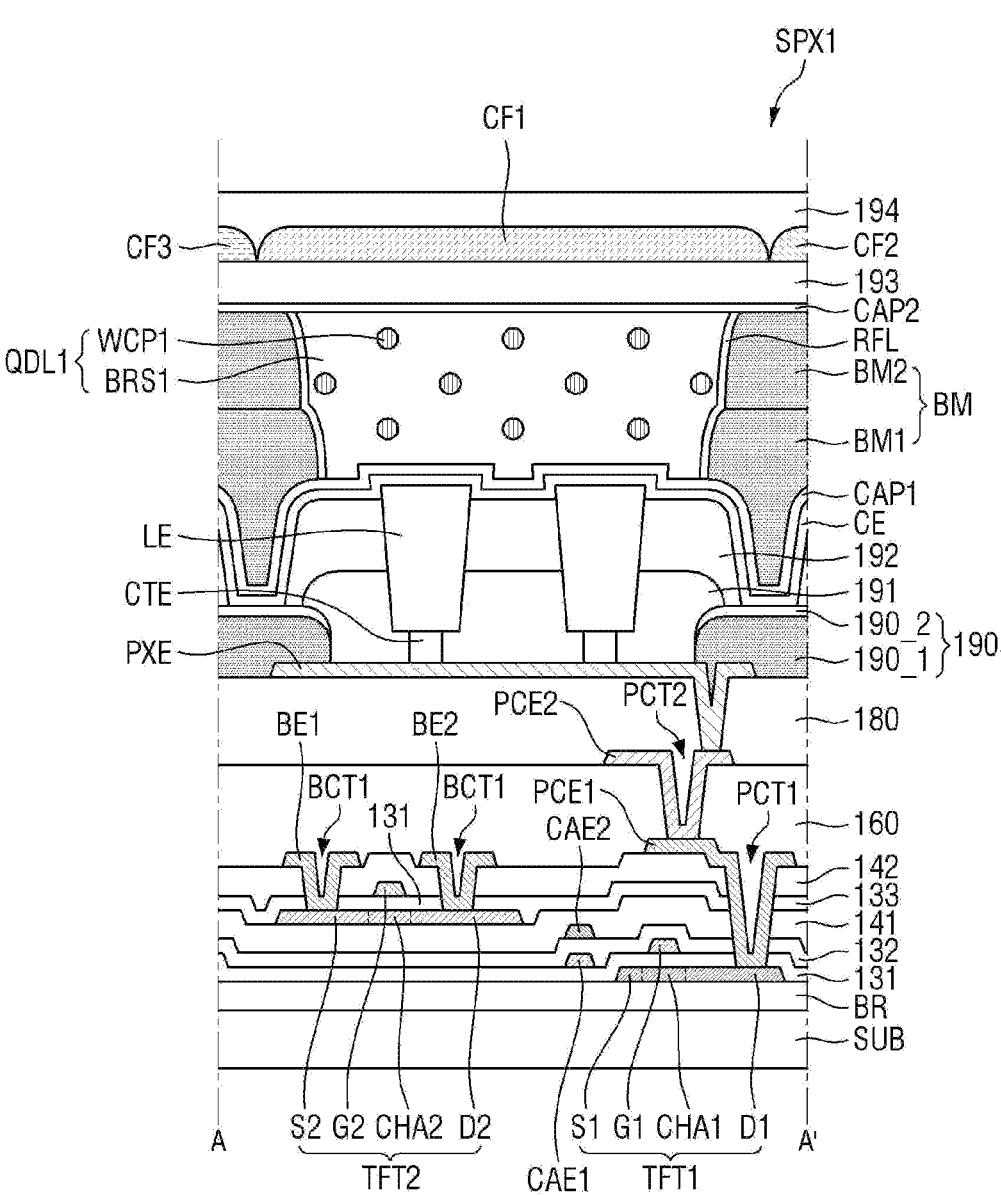
FIG. 13 is a schematic cross-sectional view illustrating another example of the display device taken along line A-A' of FIG. 5.
Figure 14:
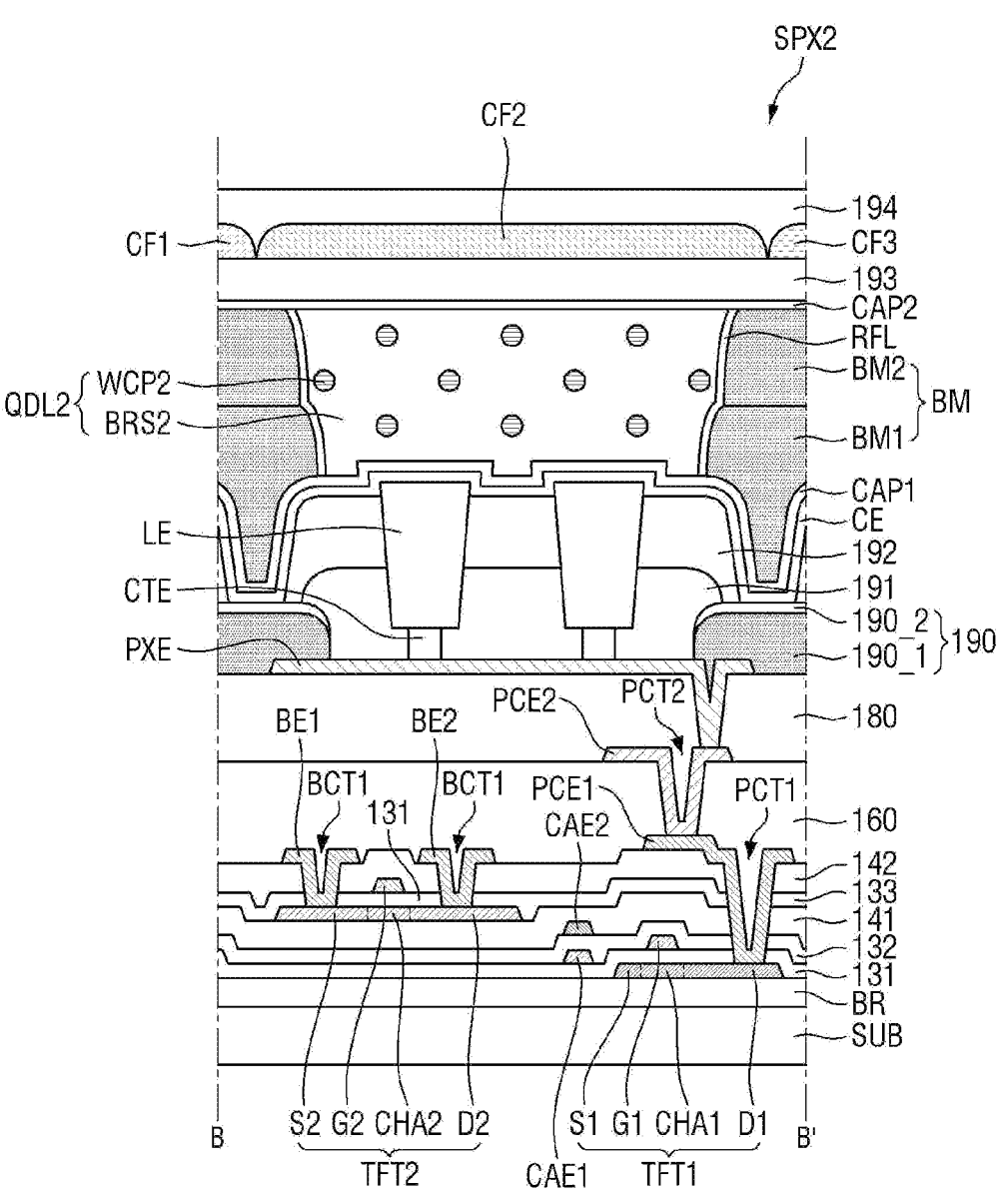
FIG. 14 is a schematic cross-sectional view illustrating another example of the display device taken along line B-B' of FIG. 5.
Figure 15:
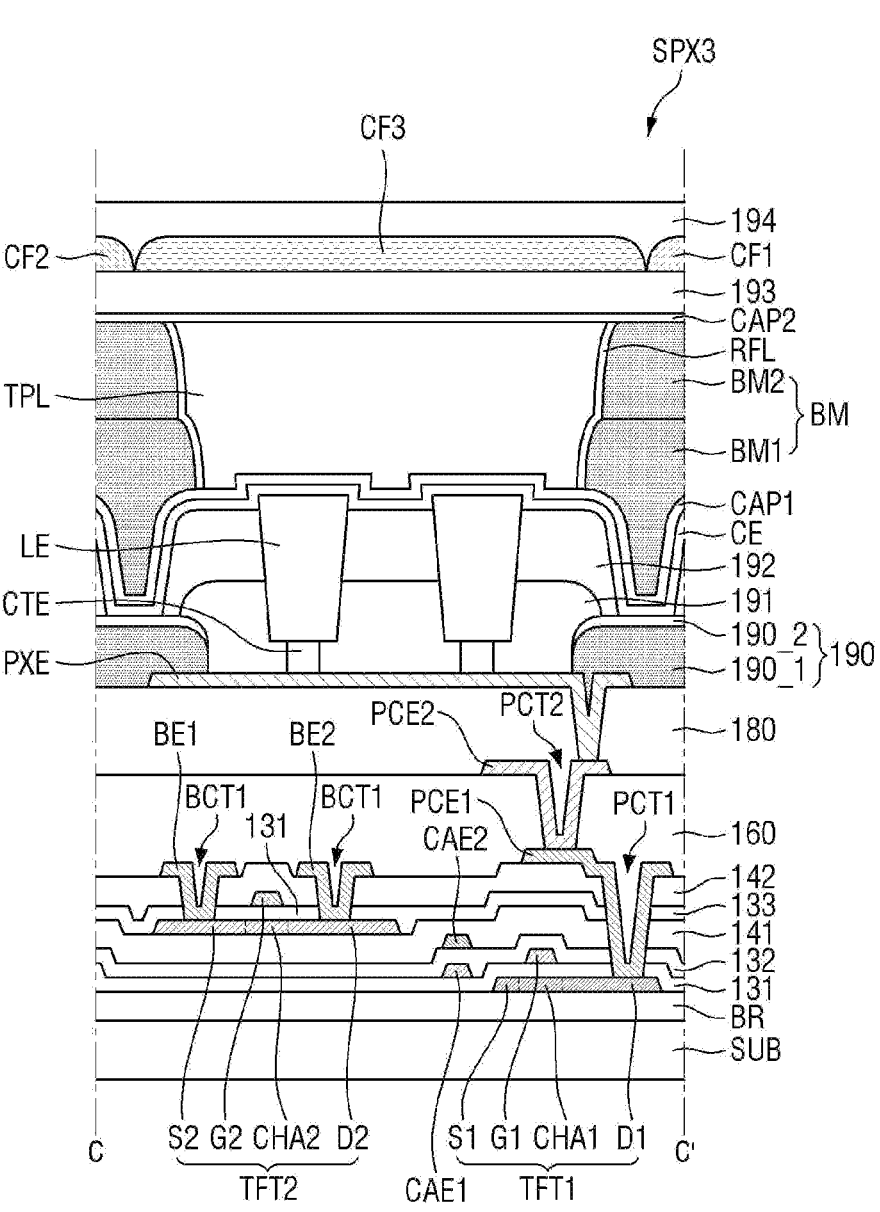
FIG. 15 is a schematic cross-sectional view illustrating another example of the display device taken along line C-C' of FIG. 5.
Figure 16:
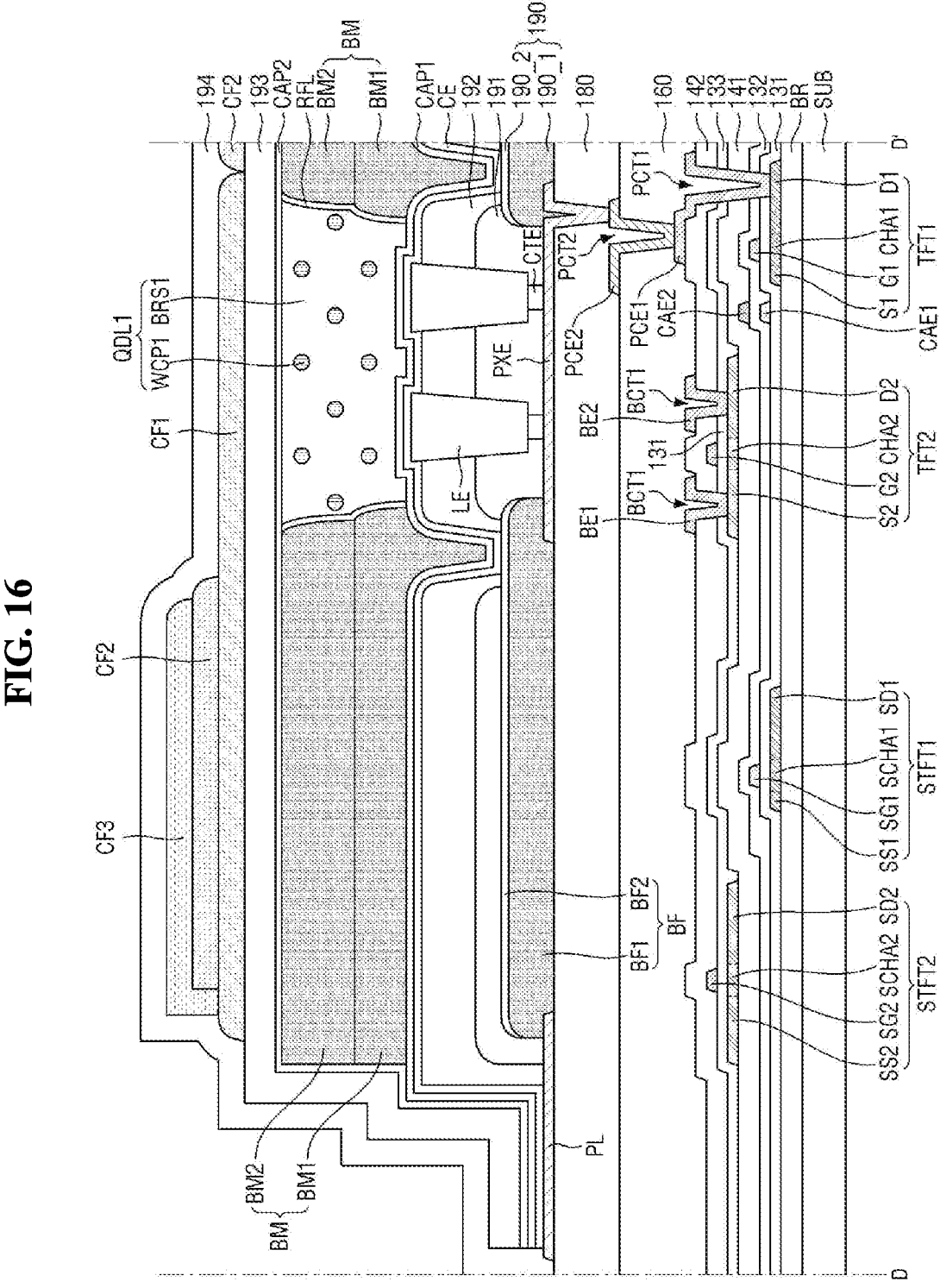
FIG. 16 is a schematic cross-sectional view illustrating another example of the display device taken along line D-D' of FIG. 2.

FIG. 13 is a schematic cross-sectional view illustrating another example of the display device taken along line A-A' of FIG. 5. FIG. 14 is a schematic cross-sectional view illustrating another example of the display device taken along line B-B' of FIG. 5. FIG. 15 is a schematic cross-sectional view illustrating another example of the display device taken along line C-C' of FIG. 5. FIG. 16 is a schematic cross-sectional view illustrating another example of the display device taken along line D-D' of FIG. 2.

An embodiment of FIGS. 13 to 16 is different from an embodiment of FIGS. 6 to 8 and 10 in that the bank 190 may include a first bank 190_1 including an organic material and a second bank 190_2 including an inorganic material and the buffer BF may include a first buffer BF1 including an organic material and a second buffer BF2 including an inorganic material. In FIGS. 13 to 16, a description of contents overlapping those of an embodiment of FIGS. 6 to 8 and 10 will be omitted.

Referring to FIGS. 13 to 16, each of the first bank 190_1 and the first buffer BF1 may be formed as an organic film made of an acrylic resin, an epoxy resin, a phenolic resin, a polyamide resin, a polyimide resin, or the like within the spirit and the scope of the disclosure. The first bank 190_1 and the first buffer BF1 may include a light blocking material, for example, an inorganic black pigment such as carbon black or an organic black pigment. The first bank 190_1 and the first buffer BF1 may be disposed on the second organic film 180 and be formed by a single manufacturing process, and may thus include the same organic material or similar organic material.

The second bank 190_2 may be disposed on the first bank 190_1, and the second buffer BF2 may be disposed on the first buffer BF1. Each of the second bank 190_2 and the second buffer BF2 may be formed as an inorganic film such as a silicon nitride layer, a silicon oxynitride layer, a silicon oxide layer, a titanium oxide layer, or an aluminum oxide layer. For example, since the second bank 190_2 and the second buffer BF2 may be formed by a single manufacturing process, and may thus include the same organic material or similar organic material.

A thickness of the first bank 190_1 may be greater than a thickness of the second bank 190_2. A thickness of the second buffer BF2 may be greater than a thickness of the first buffer BF1.

The contact electrode CTE of each of the light emitting elements LE and the pixel electrode PXE may be connected to each other by melt-bonding, adhering through a conductive adhesive member, or soldering bonding, but in case that each of the second bank 190_2 and the second buffer BF2 is formed as the inorganic film such as the silicon nitride layer, the silicon oxynitride layer, the silicon oxide layer, the titanium oxide layer, or the aluminum oxide layer, contact electrodes CTE of the dummy light emitting elements DLE disposed in the non-display area NDA are not bonded to the second buffer BF2 by a bonding process, and thus, the dummy light emitting elements DLE may fall off. Therefore, in case that each of the second bank 190_2 and the second buffer BF2 may include the inorganic material, the dummy light emitting elements DLE may not be disposed in the non-display area NDA.

Figure 17:
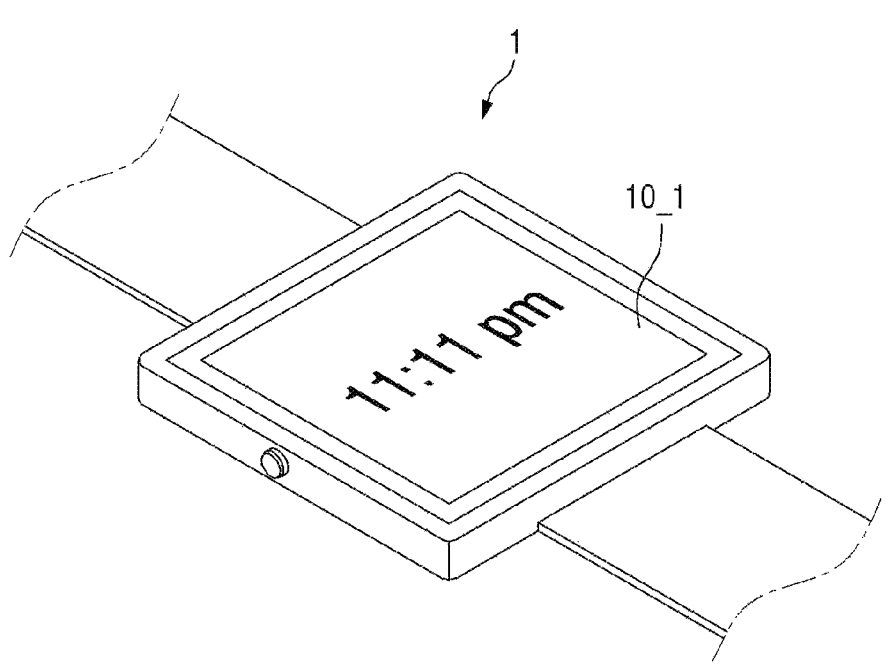
FIG. 17 is an illustrative view illustrating a smart device including a display device according to an embodiment.

FIG. 17 is an illustrative view illustrating a smart device including a display device according to an embodiment.

Referring to FIG. 17, a display device 10_1 according to an embodiment may be applied to a smart watch 1, which is one of the smart devices. A shape of a watch display unit of the smart watch 1 in plan view may follow a shape of the display device 10_1 in plan view. For example, in case that the display device 10_1 according to an embodiment has a rectangular shape in plan view as illustrated in FIG. 1, the watch display unit of the smart watch 1 may have a rectangular shape in plan view as illustrated in FIG. 17. By way of example, in case that the display device 10_1 according to an embodiment has a circular or elliptical shape in plan view, the watch display unit of the smart watch 1 may have a circular or elliptical shape in plan view. However, an embodiment is not limited thereto, and the shape of the watch display unit of the smart watch 1 in plan view may not follow the shape of the display device 10_1 in plan view.

Figure 18:
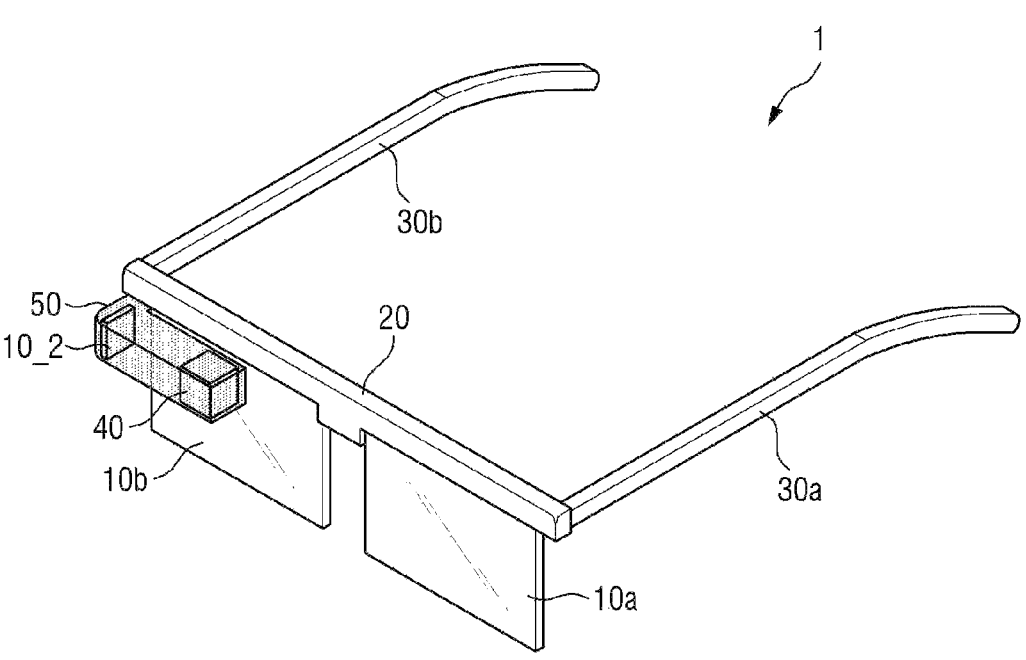
FIG. 18 is an illustrative view illustrating a virtual reality device including a display device according to an embodiment.

FIG. 18 is an illustrative view illustrating a virtual reality device including a display device according to an embodiment. A virtual reality device 1 to which a display device 10_2 according to an embodiment is applied is illustrated in FIG. 18.

Referring to FIG. 18, the virtual reality device 1 according to an embodiment may be a glasses-type device. The virtual reality device 1 according to an embodiment may include the display device 10_2, a left eye lens 10a, a right eye lens 10b, a support frame 20, eyeglass frame legs 30a and 30b, a reflective member 40, and a display device accommodating part 50.

The virtual reality device 1 including the eyeglass frame legs 30a and 30b has been illustrated in FIG. 18, but the virtual reality device 1 according to an embodiment may also be applied to a head mounted display including a head mounted band that may be mounted on a user's head instead of the eyeglass frame legs 30a and 30b. For example, the virtual reality device 1 according to an embodiment is not limited to that illustrated in FIG. 18, and may be applied in various forms to various other electronic devices.

The display device accommodating part 50 may include the display device 10_2 and the reflective member 40. An image displayed on the display device 10_2 may be reflected by the reflective member 40 and provided to a user's right eye through the right eye lens 10b. Accordingly, a user may view a virtual reality image displayed on the display device 10_2 through his/her right eye.

It has been illustrated in FIG. 18 that the display device accommodating part 50 is disposed at a right end of the support frame 20, but an embodiment is not limited thereto. For example, the display device accommodating part 50 may be disposed at a left end of the support frame 20. An image displayed on the display device 10_2 may be reflected by the reflective member 40 and provided to a user's left eye through the left eye lens 10a. Accordingly, the user may view a virtual reality image displayed on the display device 10_2 through his/her left eye. By way of example, the display device accommodating parts 50 may be disposed at both the left and right ends of the support frame 20. The user may view a virtual reality image displayed on the display device 10_2 through both his/her left and right eyes.

Figure 19:
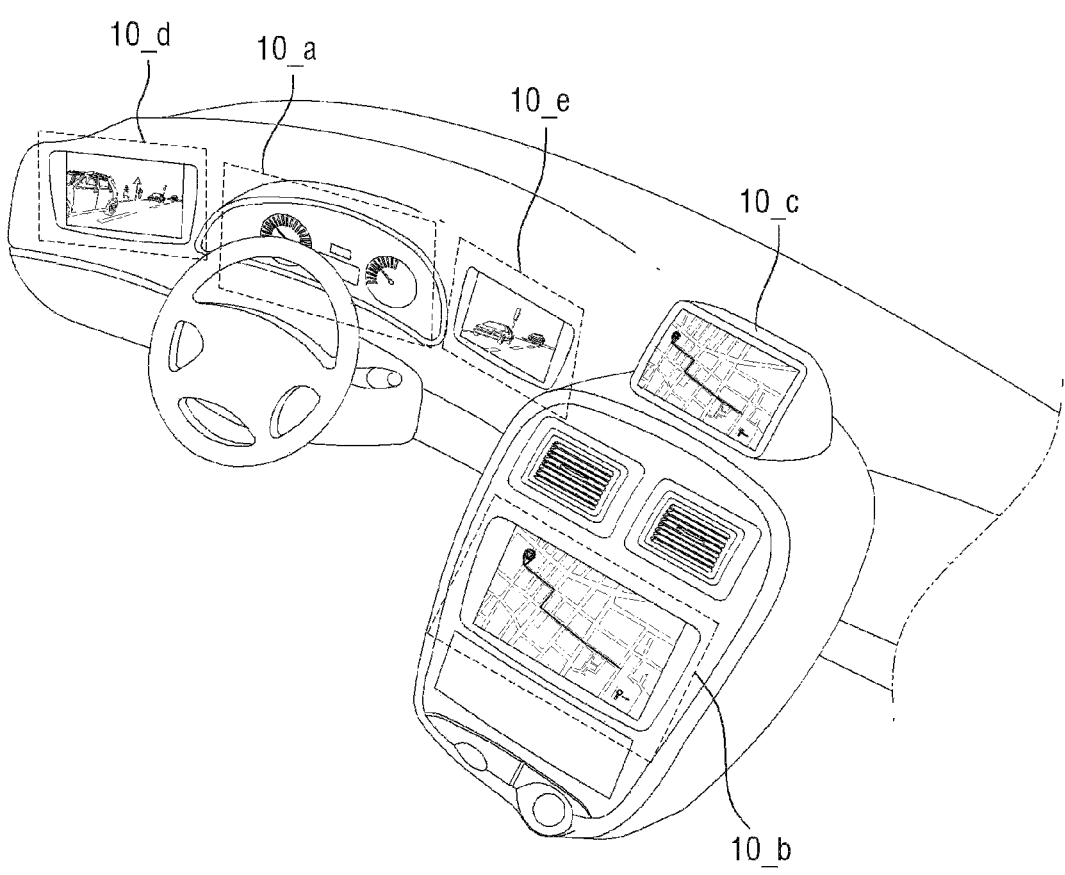
FIG. 19 is an illustrative view illustrating an instrument board and a center fascia of a vehicle including a display device according to an embodiment.

FIG. 19 is an illustrative view illustrating an instrument board and a center fascia of a vehicle including a display device according to an embodiment. A vehicle to which display devices 10_a, 10_b, 10_c, 10_d, and 10_e according to an embodiment are applied is illustrated in FIG. 19.

Referring to FIG. 19, the display devices 10_a, 10_b, and 10_c according to an embodiment may be applied to an instrument board of the vehicle, applied to a center fascia of the vehicle, or applied to a center information display (CID) disposed on a dashboard of the vehicle. The display device 10_d and 10_e according to an embodiment may be applied to a room mirror display substituting for a side mirror of the vehicle.

Figure 20:
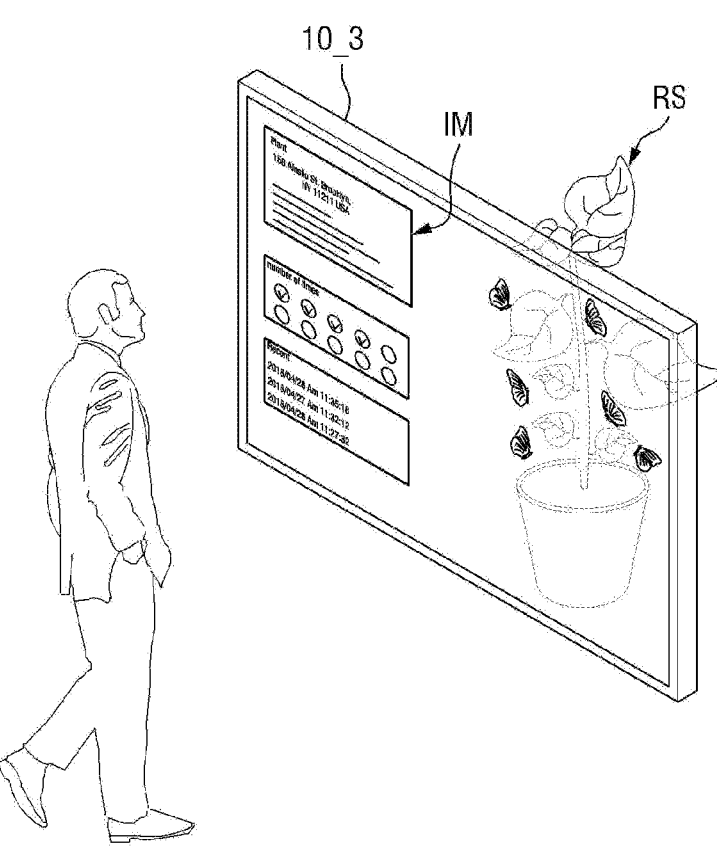
FIG. 20 is an illustrative view illustrating a transparent display device including a display device according to an embodiment.

FIG. 20 is an illustrative view illustrating a transparent display device including a display device according to an embodiment.

Referring to FIG. 20, a display device 10_3 according to an embodiment may be applied to a transparent display device. The transparent display device may transmit light therethrough while displaying an image IM. Therefore, a user positioned on a front surface of the transparent display device may not only view the image IM displayed on the display device 10_3, but also see an object RS or a background positioned on a rear surface of the transparent display device. In case that the display device 10_3 is applied to the transparent display device, a substrate SUB of the display device 10_3 may include a light transmitting part capable of transmitting light or may be made of a material capable of transmitting light.

FIG. 21 is a flowchart illustrating a manufacturing method of a display device according to an embodiment. FIGS. 22 to 35 are schematic cross-sectional views illustrating the manufacturing method of a display device according to an embodiment.

Hereinafter, a manufacturing method of a display device according to an embodiment will be described in detail with reference to FIGS. 21 to 35.

Figure 22:
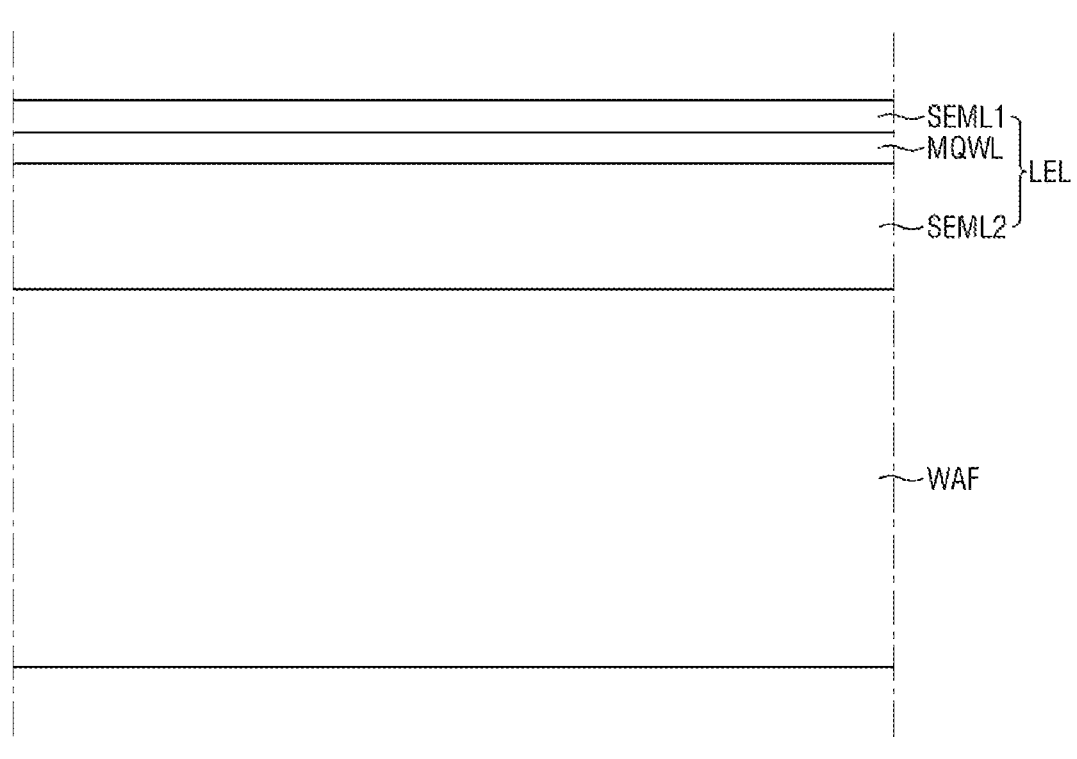
FIGS. 22 to 35 are schematic cross-sectional views illustrating the manufacturing method of a display device according to an embodiment.
Figure 23:
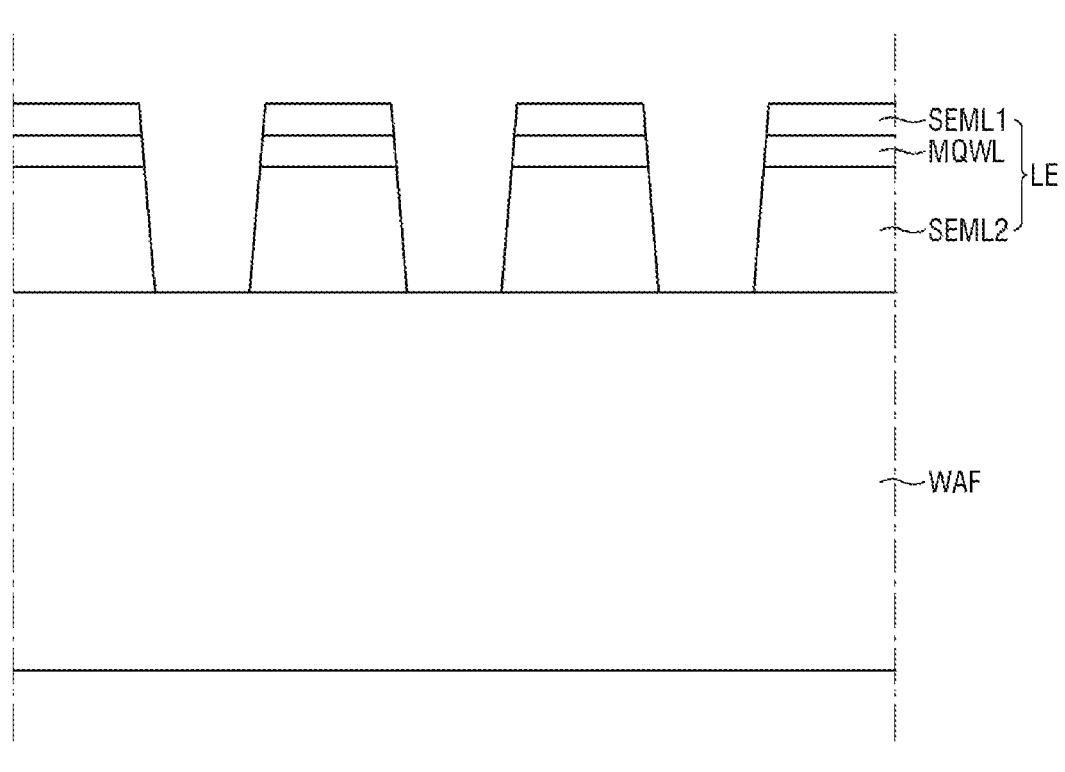

First, referring to FIGS. 22 and 23, a semiconductor material layer LEL is formed on a semiconductor substrate WAF, and light emitting elements LE are formed by etching the semiconductor material layer LEL (S110 in FIG. 21).

The semiconductor substrate WAF may be a silicon wafer substrate or a sapphire substrate. The semiconductor material layer LEL may be formed on the semiconductor substrate WAF through an epitaxial growth process. As a method of forming the semiconductor material layer through the epitaxial growth process, electron beam deposition, physical vapor deposition (PVD), chemical vapor deposition (CVD), plasma laser deposition (PLD), dual-type thermal evaporation, sputtering, metal organic chemical vapor deposition (MOCVD), or the like, may be used, but for example, metal-organic chemical vapor deposition (MOCVD) may be used.

As illustrated in FIG. 22, the semiconductor material layer LEL may include a second semiconductor material layer SEML2, an active material layer MQWL, and a first semiconductor material layer SEML1 sequentially stacked each other on the semiconductor substrate WAF.

The second semiconductor material layer SEML2 may include n-GaN obtained by doping GaN with a second conductivity-type dopant such as Si, Ge, or Sn. By way of example, the second semiconductor layer SEM2 may further include un-GaN (undoped GaN) undoped with a conductive dopant. Un-GaN may be disposed between n-GaN and the semiconductor substrate WAF.

The active material layer MQWL may be a layer in which InGaN and GaN may be alternately stacked each other, but an embodiment is not limited thereto.

The first semiconductor material layer SEML1 may include p-GaN obtained by doping GaN with a first conductivity type-dopant such as Mg, Zn, Ca, Se, or Ba.

The semiconductor material layer LEL may further include an electron blocking material layer EBL disposed between the active material layer MQWL and the first semiconductor material layer SEML1. For example, the electron blocking material layer EBL may be made of AlGaN or p-AlGaN doped with p-type Mg.

As illustrated in FIG. 23, the light emitting elements LE may be formed by forming a mask pattern on the semiconductor material layer LEL and etching the semiconductor material layer LEL according to the mask pattern. The mask pattern may be removed after the light emitting elements LE are formed.

The semiconductor material layer LEL may be etched by dry etching, wet etching, reactive ion etching (RIE), deep reactive ion etching (DRIE), inductively coupled plasma reactive ion etching (ICP-RIE), or the like within the spirit and the scope of the disclosure. In a case of the dry etching method, anisotropic etching is possible, and the dry etching method may thus be suitable for vertical etching. In case that the dry etching is used, an etching gas may be $Cl_2$, $O_2$, or the like, but is not limited thereto.

Each of the light emitting elements LE may include a first semiconductor layer SEM1, an electron blocking layer EBL, an active layer MQW, a superlattice layer SLT, and a second semiconductor layer SEM2, as illustrated in FIG. 9. In FIG. 23, the electron blocking layer EBL and the superlattice layer SLT have been omitted for convenience of explanation.

It has been illustrated that each of the light emitting elements LE is a vertical micro LED extending in the third direction DR3. Each of the light emitting elements LE may have a trapezoidal shape of which a width of a lower surface is greater than a width of an upper surface in cross section.

Figure 24:
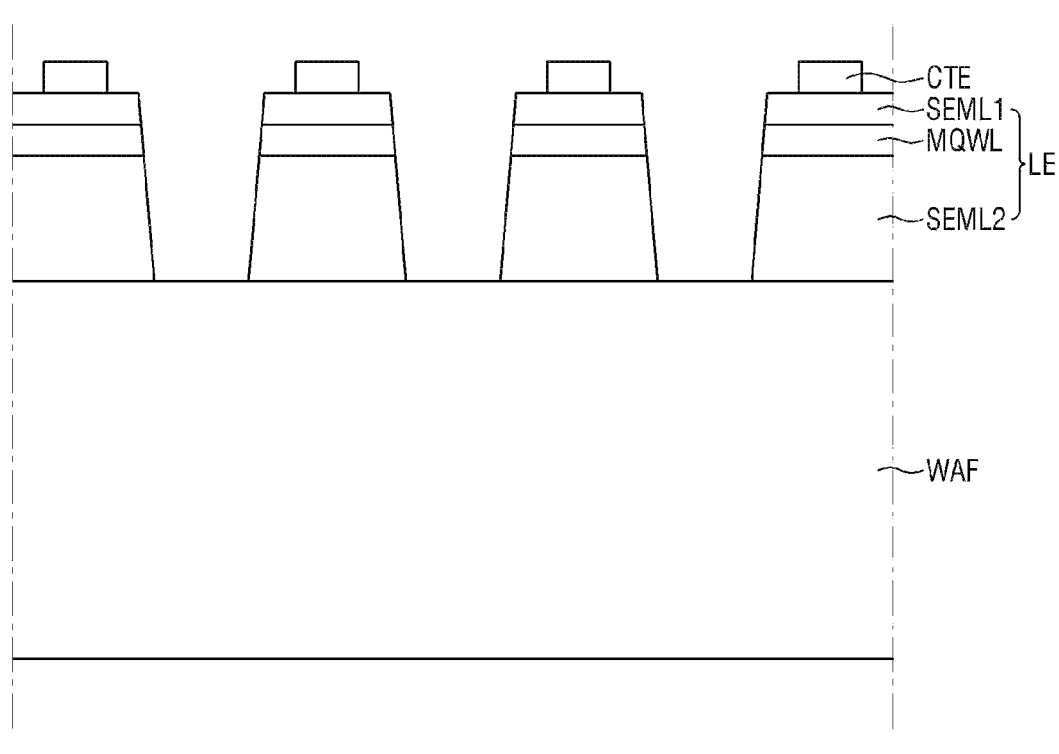
Figure 25:
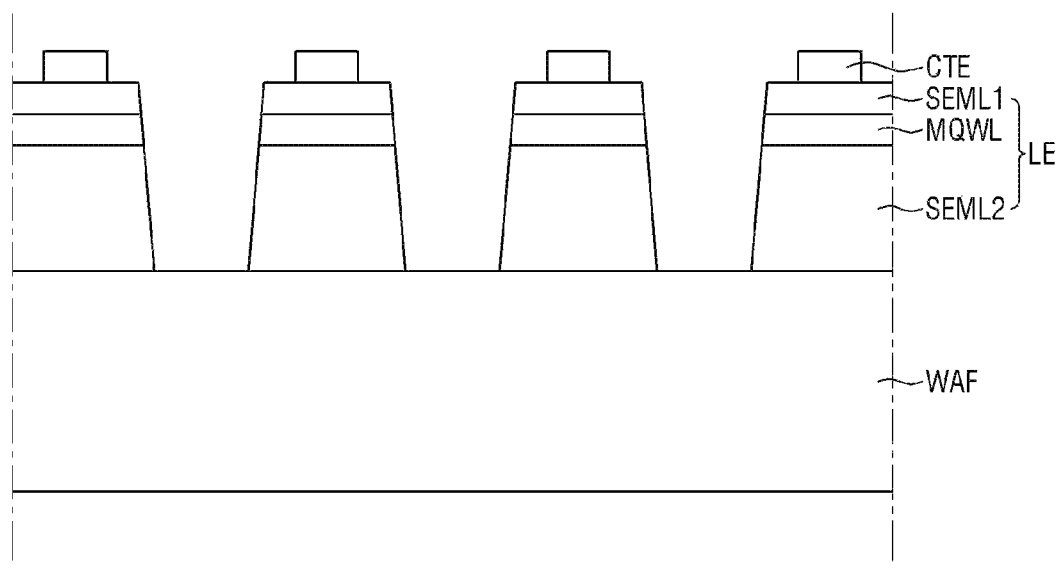

Second, as illustrated in FIGS. 24 and 25, a contact electrode CTE is formed on an upper surface of each of the light emitting elements LE, and a portion of a lower portion of the semiconductor substrate WAF is removed (S120 in FIG. 21). Therefore, a thickness of the semiconductor substrate WAF is decreased as shown in FIGS. 24 and 25.

The contact electrode CTE may include at least one of gold (Au), copper (Cu), aluminum (Al), and tin (Sn). For example, the contact electrode CTE may be made of SAC including tin (Sn), silver (Ag), and copper (Cu). A thickness of the contact electrode CTE may be about 1 to about 2 μm.

A portion of the lower portion of the semiconductor substrate WAF may be removed by a chemical mechanical polishing (CMP) process. After the chemical mechanical polishing process, a process of healing cracks generated in a lower surface of the semiconductor substrate WAF may be performed.

A protective insulating film covering side surfaces of each of the light emitting elements LE may be formed.

An anode electrode in which nickel (Ni) and aluminum (Al) are alternately deposited may be formed between the first semiconductor layer SEM1 of each of the light emitting elements LE and the contact electrode CTE.

Figure 26:
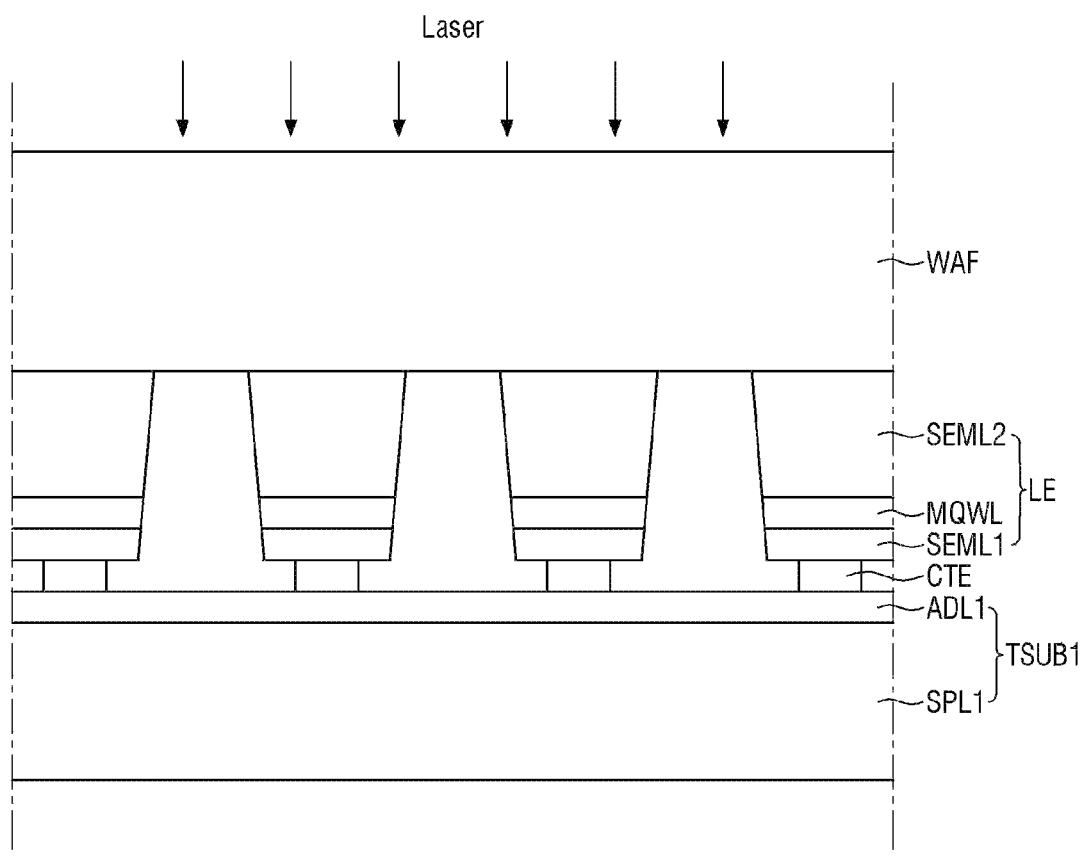
Figure 27:
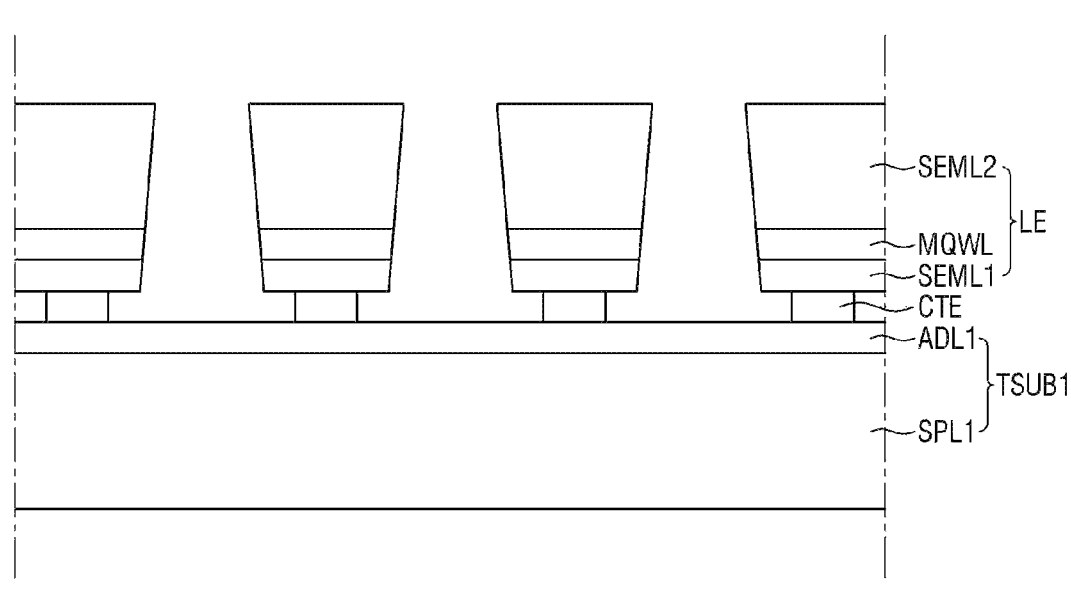

Third, as illustrated in FIGS. 26 and 27, the light emitting elements LE are transferred to a first transfer substrate TSUB1, and the semiconductor substrate WAF is detached (S130 in FIG. 21).

The first transfer substrate TSUB1 may include a first support layer SPL1 and a first adhesion layer ADL1 disposed on the first support layer SPL1. The first support layer SPL1 may be made of a transparent and expandable material so as to allow light to be transmitted therethrough. For example, the first support layer SPL1 may include a transparent polymer such as polyimide, polyester, polyacryl, polyepoxy, polyethylene, polystyrene, or polyethylene terephthalate. The first adhesion layer ADL1 may include an adhesive material for adhering the light emitting elements LE. For example, the adhesive material may include urethane acrylate, epoxy acrylate, polyester acrylate, and the like within the spirit and the scope of the disclosure.

The semiconductor substrate WAF may be separated from the light emitting elements LE by a laser lift-off (LLO) process of irradiating the semiconductor substrate WAF with a laser. The laser may be a KrF excimer laser having a wavelength of about 248 nm, but an embodiment is not limited thereto.

Figure 28:
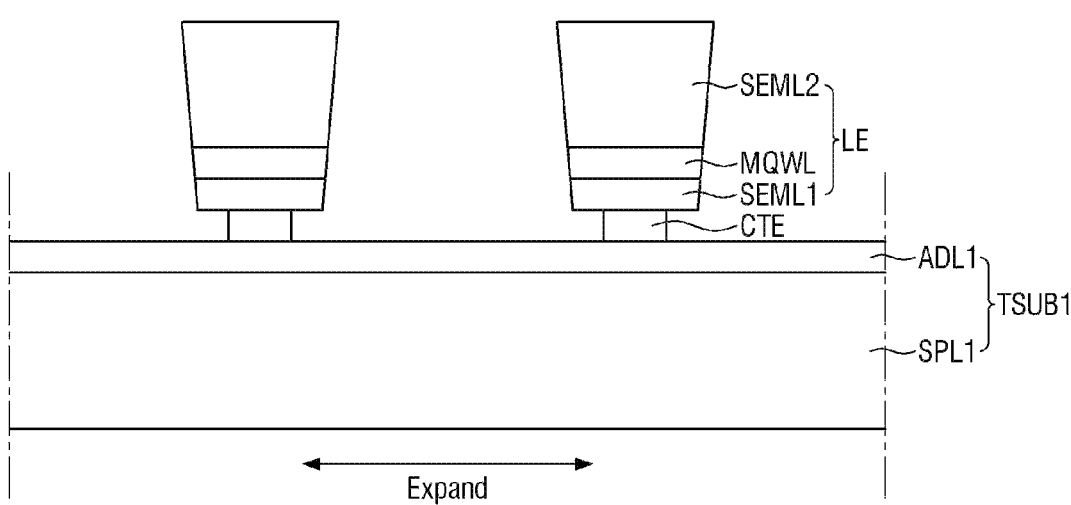
Figure 29:
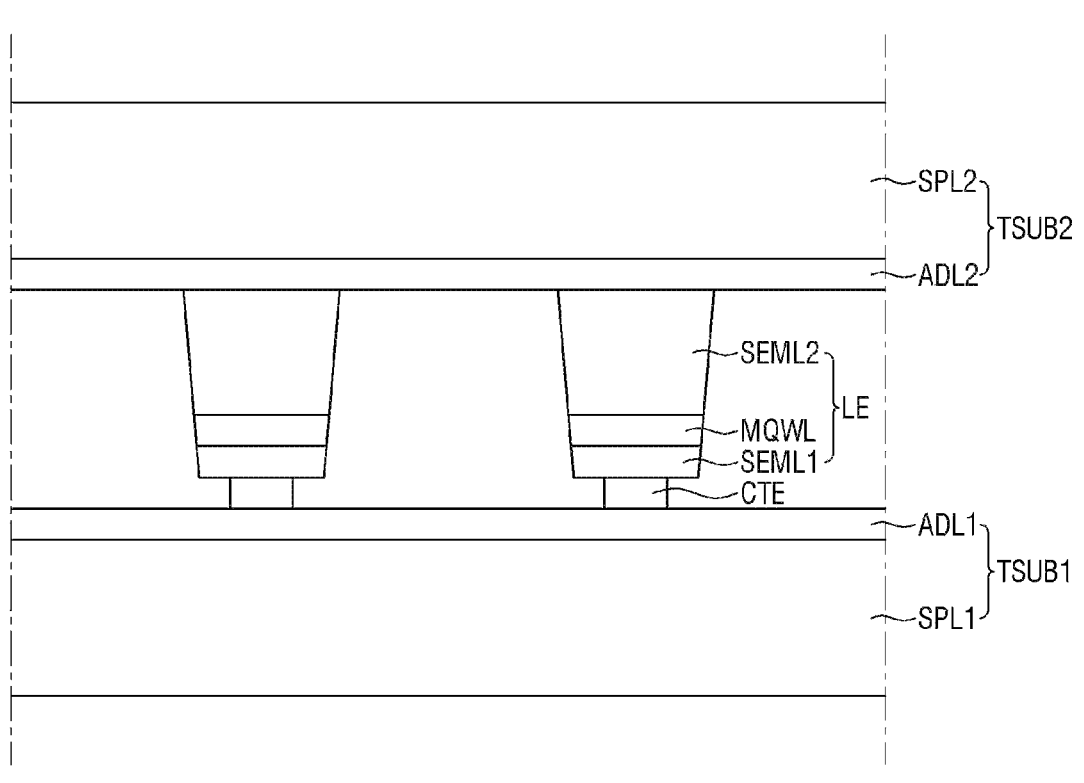
Figure 30:
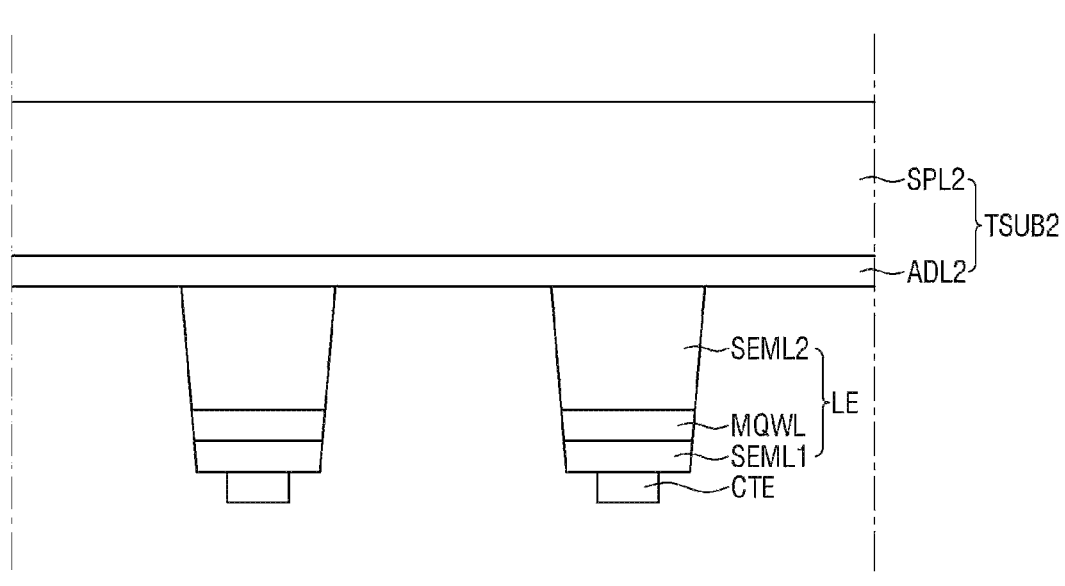

Fourth, the first transfer substrate TSUB1 is expanded as illustrated in FIG. 28, the light emitting elements LE are transferred to a second transfer substrate TSUB2 as illustrated in FIGS. 29 and 30, and the first transfer substrate TSUB1 is detached (S140 in FIG. 21).

The first transfer substrate TSUB1 may be expanded about two to three times in a direction parallel to an upper surface and a lower surface of the first transfer substrate TSUB1. It has been illustrated in FIG. 28 that the first transfer substrate TSUB1 is expanded about two times in the direction parallel to the upper surface and the lower surface of the first transfer substrate TSUB1, but an embodiment disclosure is not limited thereto.

The second transfer substrate TSUB2 may include a second support layer SPL2 and a second adhesion layer ADL2 disposed on the second support layer SPL2. The second support layer SPL2 may be made of a transparent and expandable material so as to allow light to be transmitted therethrough. For example, the second support layer SPL2 may include a transparent polymer such as polyimide, polyester, polyacryl, polyepoxy, polyethylene, polystyrene, or polyethylene terephthalate. The second adhesion layer ADL2 may include an adhesive material for adhering the light emitting elements LE. For example, the adhesive material may include urethane acrylate, epoxy acrylate, polyester acrylate, and the like within the spirit and the scope of the disclosure.

An adhesive force between the second adhesion layer and the light emitting elements LE may be superior to an adhesive force between the first adhesion layer and the light emitting elements LE. Accordingly, the first transfer substrate TSUB1 may be detached from the light emitting elements LE with the second transfer substrate TSUB2 and the light emitting elements LE adhered to each other.

Figure 31:
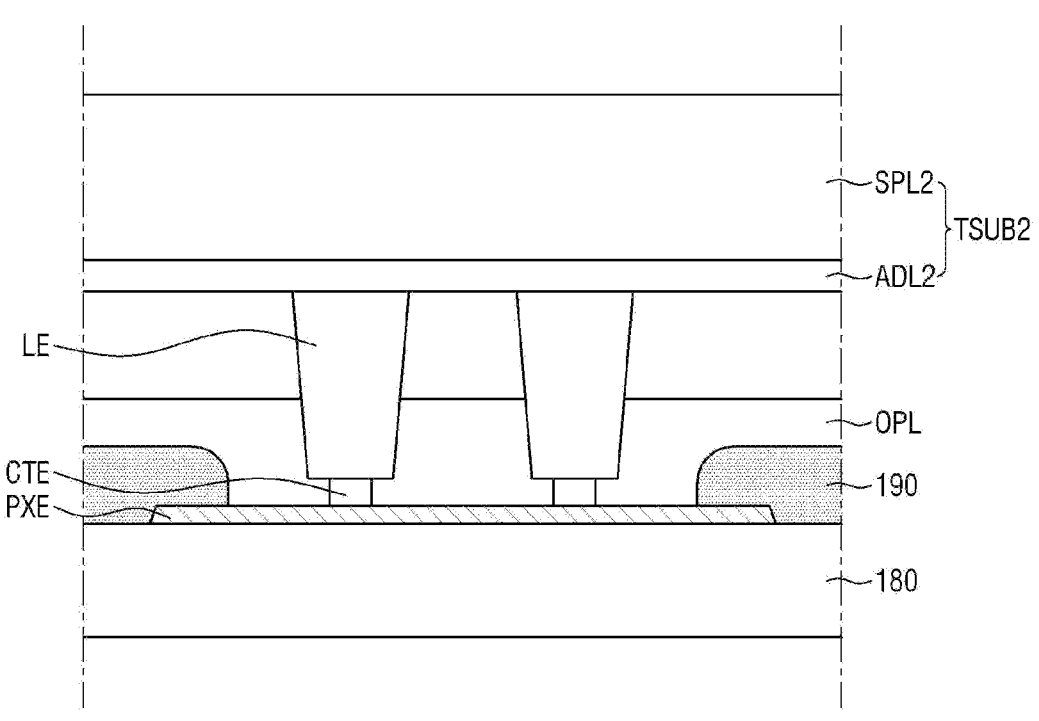

Fifth, as illustrated in FIG. 31, in a state in which the contact electrode CTE of each of the light emitting elements LE is in contact with the pixel electrode PXE of the display panel 100, an oxidation prevention film OPL covering pixel electrodes PXE and the contact electrodes CTE of the light emitting elements LE is formed (S150 in FIG. 21).

The oxidation prevention film OPL may be a film for preventing the pixel electrodes PXE from being oxidized.

Figure 32:
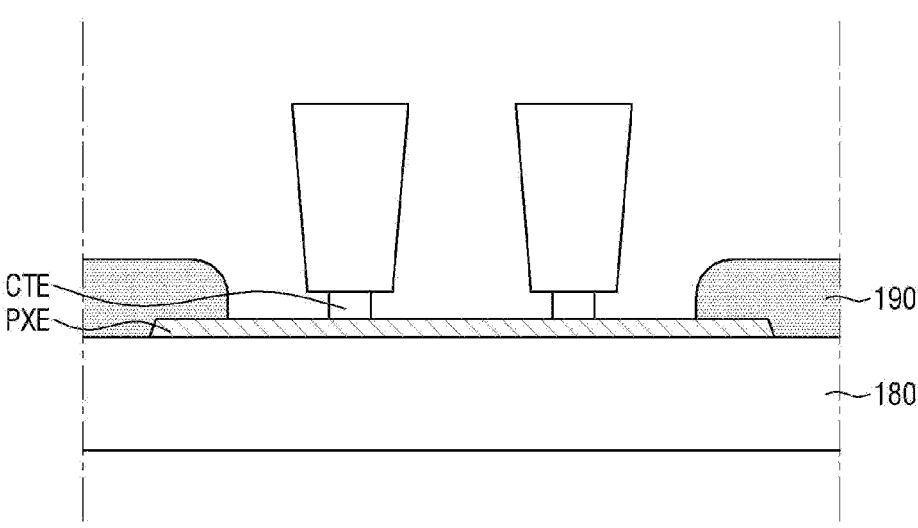

Sixth, the pixel electrodes PXE and the light emitting elements LE are adhered to each other by irradiation of a laser as illustrated in FIG. 31, and the second transfer substrate TSUB2 is detached as illustrated in FIG. 32 (S160 in FIG. 21).

The pixel electrodes PXE and the contact electrodes CTE of the light emitting elements LE may be melt-bonded to each other by performing the irradiation of the laser in a state in which the pixel electrodes PXE and the contact electrodes CTE of the light emitting elements LE are in contact with each other. In case that the pixel electrodes PXE are made of copper (Cu) and the contact electrodes CTE of the light emitting elements LE are made of SAC, a SAC—Cu alloy may be formed by melt-bonding between the pixel electrodes PXE and the contact electrodes CTE of the light emitting elements LE.

An adhesive force between the pixel electrodes PXE and the contact electrodes CTE of the light emitting elements LE by the melt-bonding may be superior to the adhesive force between the second adhesion layer of the second transfer substrate TSUB2 and the light emitting elements LE. Accordingly, the second transfer substrate TSUB2 may be detached from the light emitting elements LE with the pixel electrodes PXE and the contact electrodes CTE of the light emitting elements LE adhered to each other.

Figure 33:
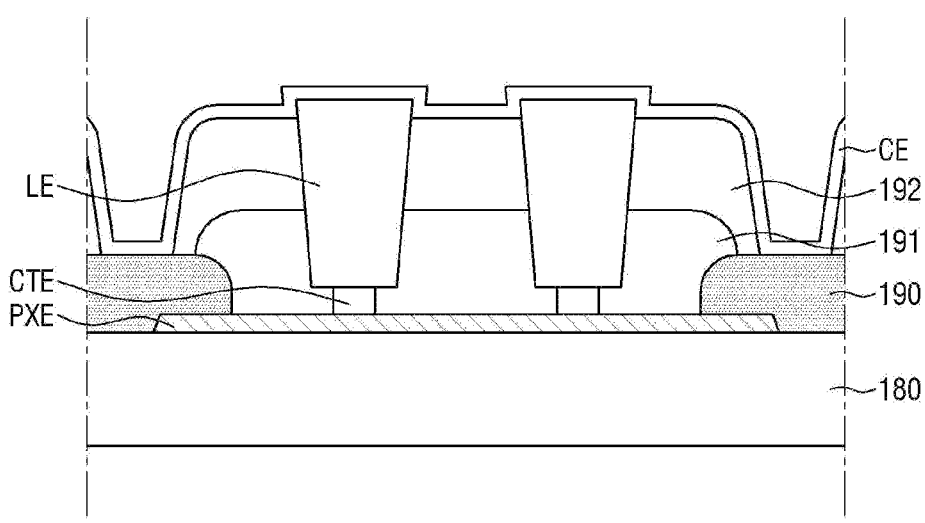

Seventh, as illustrated in FIG. 33, planarization films 191 and 192 for planarizing a step due to the light emitting elements LE are formed, and a common electrode CE is formed on the planarization films 191 and 192 and the light emitting elements LE (S170 in FIG. 21). The planarization films 191 and 192 may include a third organic film 191 and a fourth organic film 192.

Figure 34:
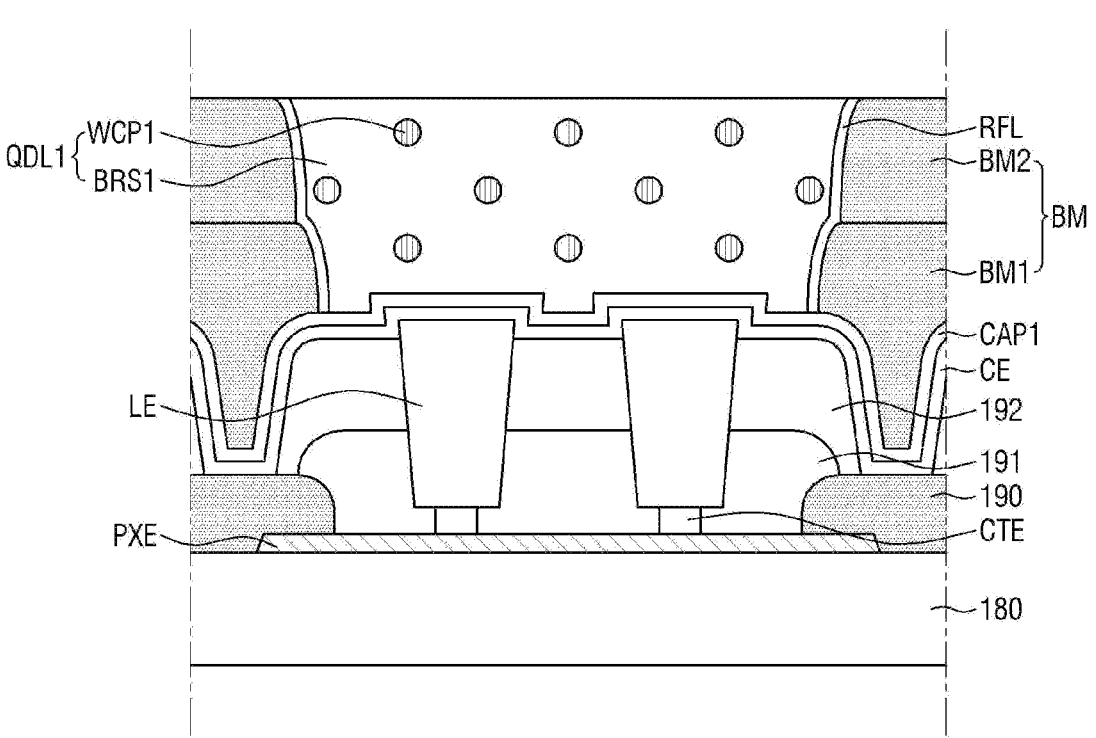
Figure 35:
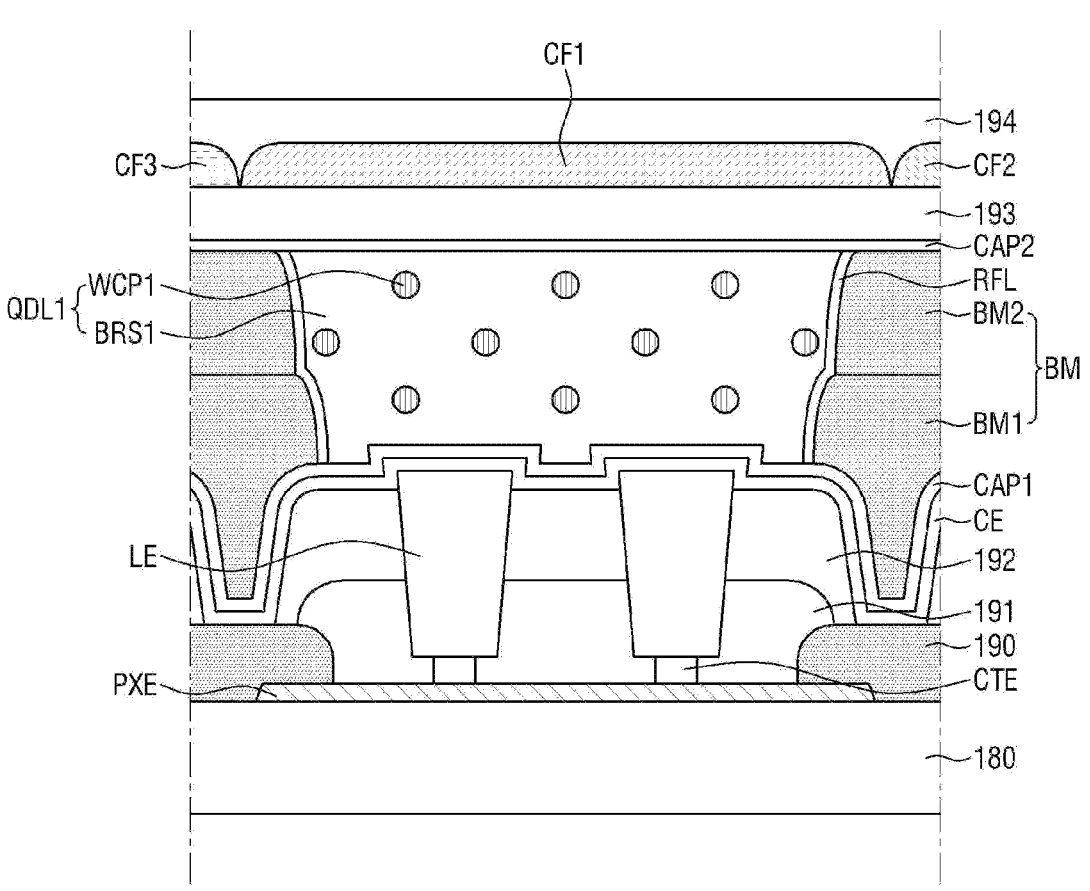

Eighth, a light blocking layer BM, light conversion layers QDL1 and QDL2, and light transmission layers TPL are formed on the common electrode CE as illustrated in FIG. 34, and color filters CF1, CF2, and CF3 are formed on the light blocking layer BM, the light conversion layers QDL1 and QDL2, and the light transmission layers TPL as illustrated in FIG. 35 (S180 in FIG. 21).

A first capping layer CAP1 may be additionally formed between the common electrode CE and the light blocking layer BM, between the common electrode CE and each of the light conversion layers QDL1 and QDL2, and between the common electrode CE and each of the light transmission layers TPL. A reflective film RFL may be additionally formed between the light blocking layer BM and the first light conversion layer QDL1, between the light blocking layer BM and the second light conversion layer QDL2, and between the light blocking layer BM and the light transmission layer TPL.

A second capping layer CAP2 may be disposed on the light blocking layer BM, the first light conversion layer QDL1, the second light conversion layer QDL2, and the light transmission layer TPL. Furthermore, a fifth organic film 193 for planarization may be disposed on the second capping layer CAP2. Color filters CF1, CF2, and CF3 may be disposed on the fifth organic film 193.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted as well by the following claims, and it should be interpreted that all technical spirits within the equivalent scope are included in the scope of the disclosure.

What is claimed is:
1. A display device comprising:
a display area and a buffer area disposed around the display area;
a substrate;

a pixel electrode disposed on the substrate in the display area;

a bank covering an edge of the pixel electrode;

light emitting elements disposed on the pixel electrode and extending in a thickness direction of the substrate; and a buffer disposed on the substrate in the buffer area, wherein the bank and the buffer are disposed on a same layer, and wherein a dummy light emitting element disposed on the buffer and extending in the thickness direction of the substrate.

2. The display device of claim 1, wherein the bank and the buffer include a same organic material.

3. The display device of claim 1, wherein a portion of the dummy light emitting element is fixed to at least a portion of the buffer.

4. The display device of claim 1, further comprising:

a common electrode disposed on the light emitting elements and the dummy light emitting element.

5. The display device of claim 1, further comprising:

a light blocking layer disposed on the dummy light emitting element in the buffer area.

6. The display device of claim 5, wherein the light blocking layer overlaps the buffer in the thickness direction of the substrate.

7. The display device of claim 5, wherein the light blocking layer is disposed on the bank in the display area and does not overlap the light emitting elements in the thickness direction of the substrate.

8. The display device of claim 7, further comprising:

a color conversion layer including color conversion elements disposed on the light emitting elements, wherein the light blocking layer partitions the color conversion layer.

9. The display device of claim 8, further comprising:

a first color filter disposed on the light blocking layer in the buffer area;

a second color filter disposed on the first color filter; and a third color filter disposed on the second color filter.

10. The display device of claim 9, wherein any one of the first color filter, the second color filter, and the third color filter is disposed on the color conversion layer.

11. A display device comprising:

a display area and a buffer area disposed around the display area;

a substrate;

a pixel electrode disposed on the substrate in the display area;

a bank covering an edge of the pixel electrode;

light emitting elements disposed on the pixel electrode and extending in a thickness direction of the substrate; and a buffer disposed on the substrate in the buffer area, wherein the bank and the buffer are disposed on a same layer, wherein the bank includes an organic material, and wherein the buffer includes an inorganic material.

12. The display device of claim 11, wherein a thickness of the bank is greater than a thickness of the buffer.

13. The display device of claim 11, wherein the buffer includes:

a first buffer disposed on the substrate and including an organic material; and a second buffer disposed on the first buffer and including an inorganic material.

14. The display device of claim 13, wherein a thickness of the first buffer is greater than a thickness of the second buffer.

15. The display device of claim 13, wherein the bank includes:

a first bank disposed on the substrate; and a second bank disposed on the first bank, the first buffer and the first bank include a same material, and the second buffer and the second bank include a same material.

16. A display device comprising:

a display area and a buffer area disposed around the display area;

a substrate;

a pixel electrode disposed on the substrate in the display area;

a bank covering an edge of the pixel electrode;

light emitting elements disposed on the pixel electrode and extending in a thickness direction of the substrate;

a buffer disposed on the substrate in the buffer area; and a light blocking layer disposed on the buffer in the buffer area and blocking light.

17. The display device of claim 16, wherein the light blocking layer is disposed on the bank in the display area and does not overlap the light emitting elements in the thickness direction of the substrate.

18. The display device of claim 17, further comprising:

a color conversion layer including color conversion elements disposed on the light emitting elements, wherein the light blocking layer partitions the color conversion layer.

19. The display device of claim 16, further comprising:

a dummy light emitting element disposed on the buffer in the buffer area and extending in the thickness direction of the substrate; and a common electrode disposed on the light emitting elements and the dummy light emitting element, wherein the light blocking layer is disposed on the common electrode.

* * * * *